United States Patent
Bito et al.

(10) Patent No.: US 9,097,778 B2
(45) Date of Patent: Aug. 4, 2015

(54) MAGNETIC RESONANCE DEVICE WITH DIFFUSION GRADIENT PHASE VARIATION POSITIONALLY CORRECTED

(75) Inventors: Yoshitaka Bito, Kokubunji (JP); Satoshi Hirata, Kodaira (JP); Hisaaki Ochi, Kodaira (JP); Koji Hirata, Kasukabe (JP); Toru Shirai, Kawasaki (JP); Yosuke Otake, Mitaka (JP)

(73) Assignee: HITACHI, LTD., Tokyo (JP)

( * ) Notice: Subject to any disclaimer, the term of this patent is extended or adjusted under 35 U.S.C. 154(b) by 945 days.

(21) Appl. No.: 13/140,484

(22) PCT Filed: Feb. 3, 2010

(86) PCT No.: PCT/JP2010/051533
§ 371 (c)(1),
(2), (4) Date: Jun. 17, 2011

(87) PCT Pub. No.: WO2010/116782
PCT Pub. Date: Oct. 14, 2010

(65) Prior Publication Data
US 2012/0049845 A1  Mar. 1, 2012

(30) Foreign Application Priority Data
Mar. 30, 2009 (JP) .................................. 2009-081232

(51) Int. Cl.
*G01R 33/485* (2006.01)
*G01R 33/563* (2006.01)

(52) U.S. Cl.
CPC ........ *G01R 33/485* (2013.01); *G01R 33/56341* (2013.01)

(58) Field of Classification Search
USPC .......................... 324/300–322; 382/128–131; 600/407–435
See application file for complete search history.

(56) References Cited

U.S. PATENT DOCUMENTS 2,887,673 A * 5/1959 Hahn ............................ 365/152
4,588,948 A   5/1986 Mansfield
(Continued)

FOREIGN PATENT DOCUMENTS

JP   59-90552 A    5/1984
JP   11-113877 A   4/1999
(Continued)

OTHER PUBLICATIONS

P. Mansfield, Spatial Mapping of the Chemical Shift in NMR, Magnetic Resonance in Medicine, vol. 1, 1984, pp. 370-386.
(Continued)

*Primary Examiner* — Melissa Koval
*Assistant Examiner* — Tiffany Fetzner
(74) *Attorney, Agent, or Firm* — Mattingly & Malur, PC

(57) ABSTRACT

In the diffusion spectroscopic imaging, in which intensity of molecular diffusion is imaged with separating chemical substances, with suppressing artifacts resulting from object motion of an object, spatial resolution, spectral band and SNR are maintained, and measurement accuracy is enhanced. A measurement for acquiring diffusion SI data is repeated a plurality of times with changing acquisition timing, phase variation of each measurement result is corrected, and a diffusion SI image is reconstructed from the corrected measurement results. In addition, the phase variation is calculated for every point in the space from the diffusion SI data acquired by each measurement or navigation data obtained by each measurement. The phase correction is independently performed for every point in the space.

18 Claims, 18 Drawing Sheets

(56) References Cited

U.S. PATENT DOCUMENTS

| | | | |
|---|---|---|---|
| 4,780,674 A * | 10/1988 | Breton et al. | 324/309 |
| RE33,391 E * | 10/1990 | Breton et al. | 324/309 |
| 5,572,124 A | 11/1996 | Bito et al. | |
| 5,786,692 A * | 7/1998 | Maier et al. | 324/307 |
| 5,833,609 A * | 11/1998 | Dannels et al. | 600/410 |
| 6,541,970 B1 | 4/2003 | Takizawa et al. | |
| 6,842,000 B2 * | 1/2005 | Norris et al. | 324/309 |
| 6,856,132 B2 * | 2/2005 | Appel et al. | 324/303 |
| 7,535,226 B2 * | 5/2009 | Takahashi et al. | 324/309 |
| 7,689,262 B2 * | 3/2010 | Kruger et al. | 600/410 |
| 7,847,549 B2 * | 12/2010 | Takahashi et al. | 324/307 |
| 7,868,614 B2 * | 1/2011 | Bito et al. | 324/307 |
| 7,894,891 B2 * | 2/2011 | Song et al. | 600/546 |
| 8,473,046 B2 * | 6/2013 | Song et al. | 600/546 |
| 2004/0071324 A1 * | 4/2004 | Norris et al. | 382/128 |
| 2004/0090230 A1 * | 5/2004 | Appel et al. | 324/307 |
| 2005/0033154 A1 * | 2/2005 | deCharms | 600/410 |
| 2005/0237057 A1 | 10/2005 | Porter | |
| 2007/0164742 A1 * | 7/2007 | Bito et al. | 324/318 |
| 2007/0238969 A1 * | 10/2007 | Song et al. | 600/410 |
| 2008/0001600 A1 * | 1/2008 | deCharms | 324/309 |
| 2008/0111546 A1 * | 5/2008 | Takahashi et al. | 324/307 |
| 2009/0179642 A1 * | 7/2009 | deCharms | 324/309 |
| 2010/0219828 A1 * | 9/2010 | Takahashi et al. | 324/309 |
| 2011/0105886 A1 * | 5/2011 | Song et al. | 600/410 |
| 2011/0301448 A1 * | 12/2011 | deCharms | 600/410 |
| 2012/0049845 A1 * | 3/2012 | Bito et al. | 324/309 |
| 2013/0049756 A1 * | 2/2013 | Ernst et al. | 324/322 |
| 2013/0182932 A1 * | 7/2013 | Chen et al. | 382/131 |
| 2014/0266195 A1 * | 9/2014 | Levin | 324/309 |

FOREIGN PATENT DOCUMENTS

| | | |
|---|---|---|
| JP | 3369688 B2 | 11/2002 |
| JP | 3588690 B2 | 8/2004 |
| JP | 2005-296663 A | 10/2005 |
| JP | 3891667 B2 | 12/2006 |

OTHER PUBLICATIONS

S. Matsui et al., High-Speed Spatially Resolved NMR Spectroscopy Using Phase-Modulated Spin-Echo Trains. Expansion of the Spectral Bandwidth by Combined Use of Delayed Spin-Echo Trains, Journal of Magnetic Resonance, vol. 64, 1985, pp. 167-171.

E. Adalsteinsson et al., Volumetric Spectroscopic Imaging with Spiral-Based k-Space Trajectories, Magnetic Resonance in Medicine, vol. 39, 1998, pp. 889-898.

E.O. Stejskal et al., Spin Diffusion Measurements: Spin Echoes in the Presence of a Time-Dependent Field Gradient, Journal of Chemical Physics, vol. 42, 1965, pp. 288-292.

I. Ronen et al., Towards Quantitative Diffusion-Weighed Chemical Shift Imaging of Brain Metabolites, International Society for Magnetic Resonance in Medicine Proceedings, May 9, 2008, p. 3356.

Y. Bito et al., Echo-Planar Diffusion Spectroscopic Imaging: Reduction of Motion Artifacts Using Line-Scan Technique, International Society for Magnetic Resonance in Medicine Proceedings, May 25, 1998, p. 1235.

C. Lin et al., Reduced Encoding of Diffusions Spectrum Imaging with Cross-term Correction, International Society for Magnetic Resonance in Medicine Proceedings, Jan. 27, 2003, p. 2141.

* cited by examiner

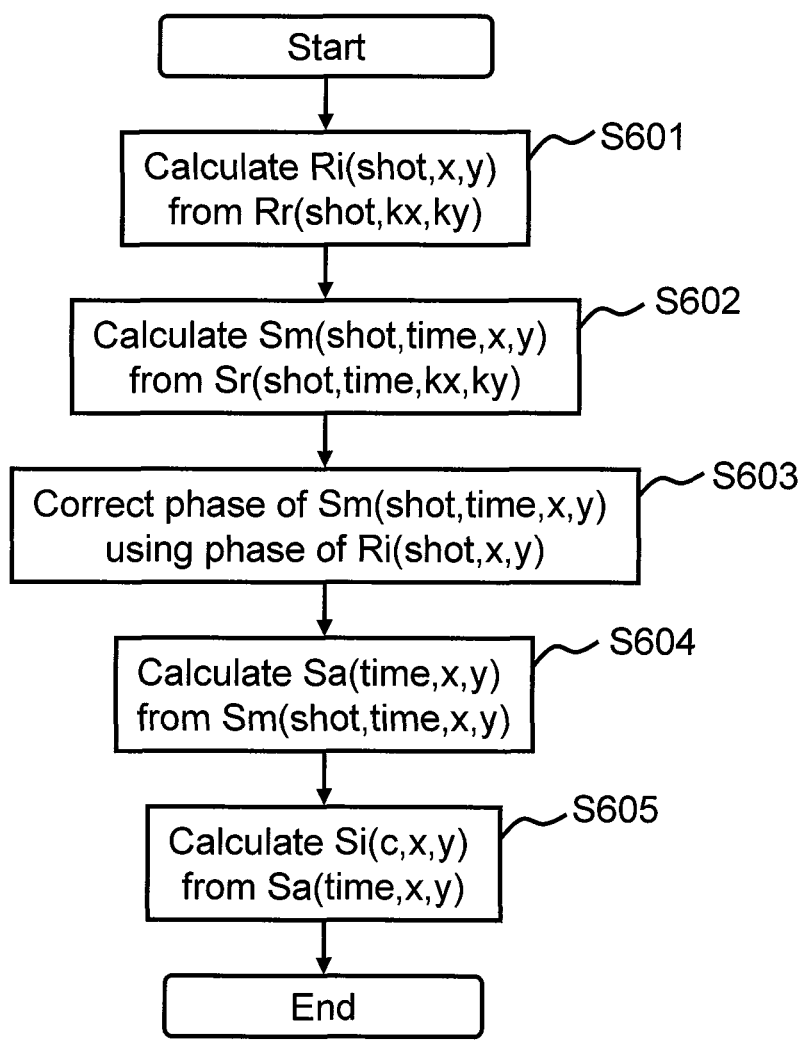

405

MAGNETIC RESONANCE DEVICE WITH DIFFUSION GRADIENT PHASE VARIATION POSITIONALLY CORRECTED

TECHNICAL FIELD

The present invention relates to a technique of diffusion spectroscopic imaging (SI), in which chemical substances are separated and spatial distribution of the molecular diffusion thereof is measured by using a magnetic resonance device.

BACKGROUND ART

Magnetic resonance devices are devices for obtaining (measuring) physicochemical information of an object by irradiating a radio frequency magnetic field of a specific frequency (RF pulse) on the object placed in a static magnetic field to induce a nuclear magnetic resonance phenomenon. Among the measurements using magnetic resonance devices, magnetic resonance imaging (MRI) is currently widely used, in which physical parameters varying depending on types of biological tissues such as proton density and difference of relaxation time are imaged. This technique also includes imaging in which signal intensities are modulated with physical parameters.

The measurements using magnetic resonance devices also include a technique called spectroscopic imaging (SI), in which not only the proton density is measured, but also density distribution is measured for each of molecular species including hydrogen atom ($^1$H), phosphorus atom ($^{31}$P), fluorine atom ($^{19}$F), carbon atom ($^{13}$C), oxygen atom ($^{17}$O), and so forth. This is a technique of separating magnetic resonance signals into those of each molecule on the basis of differences of magnetic resonance frequencies (chemical shifts) induced by differences of chemical bonds in the molecules, and imaging density, relaxation time or the like of each molecular species. In SI, in order to obtain the multi-dimensional information, i.e., chemical shifts and spatial information, it is necessary to scan a multi-dimensional measurement space, and thus the measurement time is prolonged. As a means for solving this problem, a method of scanning such a multi-dimensional measurement space in a short time by using an oscillating gradient has been proposed (refer to, for example, Non-patent document 1). Moreover, in the scanning with an oscillating gradient, the maximum value, the maximum slew rate, and so forth of the gradient magnetic field are restricted, and therefore a technique called interleaving in time domain has been proposed, in which the measurement is repeated with shifting starting time of the addition of the oscillating gradient to fill the k-space (refer to, for example, Non-patent documents 2 and 3 and Patent document 1).

One of the physical parameters attracting attention in recent years in view of the high clinical significance thereof is the diffusion coefficient, which represents intensity of molecular diffusion. The diffusion coefficient measured in MRI strongly reflects properties of tissues or cells, and differs from diffusion coefficient of simple molecular diffusion, and therefore it is called apparent diffusion coefficient (ADC). Pulse sequences currently widely used for measuring this ADC are those based on the pulse sequence of Stejskal-Tanner (refer to, for example, Non-patent document 4). In this measurement technique, after nuclear spins are excited with a radio frequency magnetic field, two or more self-compensating gradient magnetic fields are added to obtain signals. The term "self-compensating" used here means that influences of rotating phases of nuclear spins are offset unless molecules are moving. In a typical example, two gradient magnetic fields having the same shape, duration and amplitude, but added with positive and negative sign, respectively, are given.

When there is molecular diffusion, even if self-compensating gradient magnetic fields are added, the influence of rotating the phase cannot be completely offset, and signal intensity is attenuated at a rate corresponding to the added durations, intervals, and amplitudes of the gradient magnetic fields. A technique using the above attenuation for obtaining a diffusion weighted image is called diffusion weighted imaging (DWI), in which intensities of signals representing characteristics of tissues are attenuated according to the intensity of diffusion. The measurement is further performed a plurality of times with varying durations, intervals and amplitudes of the gradient magnetic fields, ADCs are calculated from the obtained attenuation factors of the signal intensity and imaged to obtain an ADC map. The diffusion weighted imaging, measurement of ADCs, and acquisition of ADC map are collectively called diffusion measurement.

One of the objects of the diffusion measurement is suppression of motion artifacts. Positional changes due to pulsation and respiration of the measurement object may exceed sub-millimeter order and reach several millimeter order, and the positional changes are quite larger compared with ADC. However, since such positional changes due to object motion may be considered coherent phase variations, if DWI can be attained by one measurement, motion artifacts are not particularly generated. In contrast, when phase encoding or signal accumulation is performed, coherent phase variations due to object motion generate motion artifacts. As a method for suppressing motion artifacts in such a case, there has been proposed a method of obtaining navigation data for detecting phase variations due to object motions, and correcting measurement results by using the data (refer to, for example, Patent documents 2 and 3).

There is a measurement called diffusion SI, in which SI and the diffusion measurement are combined, and with separating chemical substances such as metabolites contained in a measurement object, spatial distributions of the molecular diffusion thereof are measured. In the diffusion SI, the aforementioned motion artifacts are generated in a still larger amount. This is because signal accumulation is performed in order to measure metabolites showing lower signal intensity compared with water signals with sufficient accuracy. Moreover, in order to measure ADCs of metabolites showing lower ADC compared with water molecules, it is necessary to perform the diffusion weighting in a greater amount, and therefore a stronger diffusion gradient is added. Therefore, the motion artifacts tend to become larger. In particular, if the phase encoding is performed, which is an imaging method generally used in SI, ghosting artifacts are generated in the direction of the phase encoding. Moreover, the influence of the signal attenuation at the time of signal accumulation cannot be disregarded, either.

There has been proposed a diffusion SI method in which an oscillating gradient is used to decrease the influence of the phase encoding and suppress motion artifacts (refer to, for example, Patent document 4). Furthermore, there has been proposed a diffusion SI method using a method of narrowing a region where the nuclear magnetic resonance phenomenon is induced, which is called line scan, and an oscillating gradient in combination to avoid use of phase encoding (for example, Patent document 5).

PRIOR ART REFERENCES

Patent Documents

Patent document 1: Japanese Patent Unexamined Publication (KOKAI) No. 59-90552
Patent document 2: Japanese Patent No. 3891667
Patent document 3: Japanese Patent Unexamined Publication No. 11-113877
Patent document 4: Japanese Patent No. 3369688
Patent document 5: Japanese Patent No. 3588690

Non-Patent Documents

Non-patent document 1: Mansfield et al., Magnetic Resonance in Medicine, 1984, Vol. 1, pp.370-386
Non-patent document 2: Matsui et al., Journal of Magnetic Resonance, 1985, Vol. 64, pp.167-171
Non-patent document 3: Adalsteinsson et al., Magnetic Resonance in Medicine, 1998, Vol. 39, pp.889-898
Non-patent document 4: Stejskal et al., Journal of Chemical Physics, 1965, Vol. 42, pp.288-292

SUMMARY OF THE INVENTION

Problem to be Solved by the Invention

In the diffusion SI, the motion artifact suppression effect of the method disclosed in Patent document 4 may be limited. For example, if the phase encoding is performed for one axis and an oscillating gradient is used for one axis, ghosting artifacts are generated in the phase encoding axis direction. Moreover, when a multi-dimensional measurement space is scanned by one time of measurement with adding oscillating gradients for two axes, either the spatial resolution or the spectral bandwidth must be reduced due to the aforementioned restriction on the gradient magnetic field, and therefore desired results cannot necessarily be obtained.

According to the method disclosed in Patent document 5, although motion artifacts can be suppressed, measurement accuracy is reduced. In this method, one axis is used as the line scan direction, and an oscillating gradient is used for another axis. Therefore, ghosting artifacts are not generated, because phase encoding is not used. However, since the line scan uses only a part of nuclear magnetization within a usual slice, the signal to noise ratio (SN ratio, SNR) reduces as a result, compared with the case where all the nuclear magnetization is used for the measurement.

The present invention was accomplished in view of the aforementioned circumstances, and an object of the present invention is to provide a technique for simultaneously achieving suppression of artifacts resulting from object motions of a measurement object and maintenance of SNR, spatial resolution, and spectral bandwidth, and realizing highly precise measurement in the diffusion SI, in which, while chemical substances are separated, intensity of molecular diffusion thereof is imaged.

Means to Solve the Problem

According to the present invention, the measurement for obtaining diffusion SI data is repeated a plurality of times with changing acquisition timing, phase variation in each measurement result is corrected, and a diffusion SI image is reconstructed from the corrected measurement results. In addition, the phase variation is calculated from the diffusion SI data obtained in each measurement, or the navigation data obtained in each measurement, and phase correction is independently performed for every point on the space.

Specifically, there is provided a magnetic resonance device comprising a static magnetic field generating means for generating a static magnetic field, a radio frequency magnetic field transmitting means for irradiating a radio frequency magnetic field on an object placed in the static magnetic field, a radio frequency magnetic field receiving means for receiving nuclear magnetic resonance signals from the object, a gradient magnetic field adding means for spatially modulating the nuclear magnetic resonance signals from the object, a control means for controlling operations of the radio frequency magnetic field transmitting means, the gradient magnetic field adding means, and the radio frequency magnetic field receiving means, and a data processing means for calculating diffusion spectroscopic imaging data of the object by using the nuclear magnetic resonance signals received by the radio frequency magnetic field receiving means, wherein: the control means comprises: a radio frequency magnetic field pulse adding means for making the radio frequency magnetic field transmitting means add a radio frequency magnetic field pulse for inducing a nuclear magnetic resonance phenomenon in the object, a diffusion gradient adding means for, after the addition of the radio frequency magnetic field pulse, making the gradient magnetic field adding means add a diffusion gradient, and a nuclear magnetic resonance signal acquisition means for making the radio frequency magnetic field receiving means acquire nuclear magnetic resonance signals with making the gradient magnetic field adding means add an oscillating gradient, after the addition of the diffusion gradient, a shot consisting of a series of operations of the radio frequency magnetic field pulse adding means, the diffusion gradient adding means, and the nuclear magnetic resonance signal acquisition means is repeated with changing time intervals from the addition of the radio frequency magnetic field pulse to start of the addition of the oscillating gradient and start of the acquisition of the nuclear magnetic resonance signals, and the data processing means comprises: a phase variation calculating means for calculating phase variation for each position in the real space for every shot, a phase correction means for correcting phase of each of the nuclear magnetic resonance signals of the shot at a position by using the phase variation calculated above for the position in the real space for every shot, and a diffusion SI calculating means for calculating diffusion spectroscopic imaging data from the nuclear magnetic resonance signals after the phase correction.

There may be also provided the magnetic resonance device, wherein the phase variation calculating means of the aforementioned magnetic resonance device corrects the nuclear magnetic resonance signals acquired for every shot according to starting time of addition of the shot, and calculates phase variation for each position in the real space for every shot.

There may be also provided the magnetic resonance device, wherein the nuclear magnetic resonance signal acquisition means of the aforementioned magnetic resonance device further comprises a navigator signal acquisition means for making the radio frequency magnetic field receiving means acquire navigator magnetic resonance signals with making the gradient magnetic field adding means add a navigator oscillating gradient for every shot, after the addition of the diffusion gradient, and after a certain duration from the addition of the radio frequency magnetic field pulse, and the phase variation calculating means calculates phase variation for each position in the real space for every shot by using the navigator magnetic resonance signals for the shot instead of the nuclear magnetic resonance signals obtained in the shot.

Effect of the Invention

According to the present invention, suppression of artifacts resulting from object motions of a measurement object and maintenance of SNR, spatial resolution, and spectral bandwidth can be simultaneously achieved, and highly precise measurement can be realized in the diffusion SI, in which, while chemical substances are separated, intensity of molecular diffusion thereof is imaged.

BRIEF DESCRIPTION OF THE DRAWINGS

FIG. 6 is a flowchart of the data processing according to the first embodiment.

MODES FOR CARRYING OUT THE INVENTION

<<First Embodiment>>

Hereafter, the first embodiment of the present invention will be explained. In all of the drawings for explaining the embodiments of the present invention, elements having the same function are indicated with the same numerals or symbols, and repetition of the explanations thereof are omitted.

Figure 1:
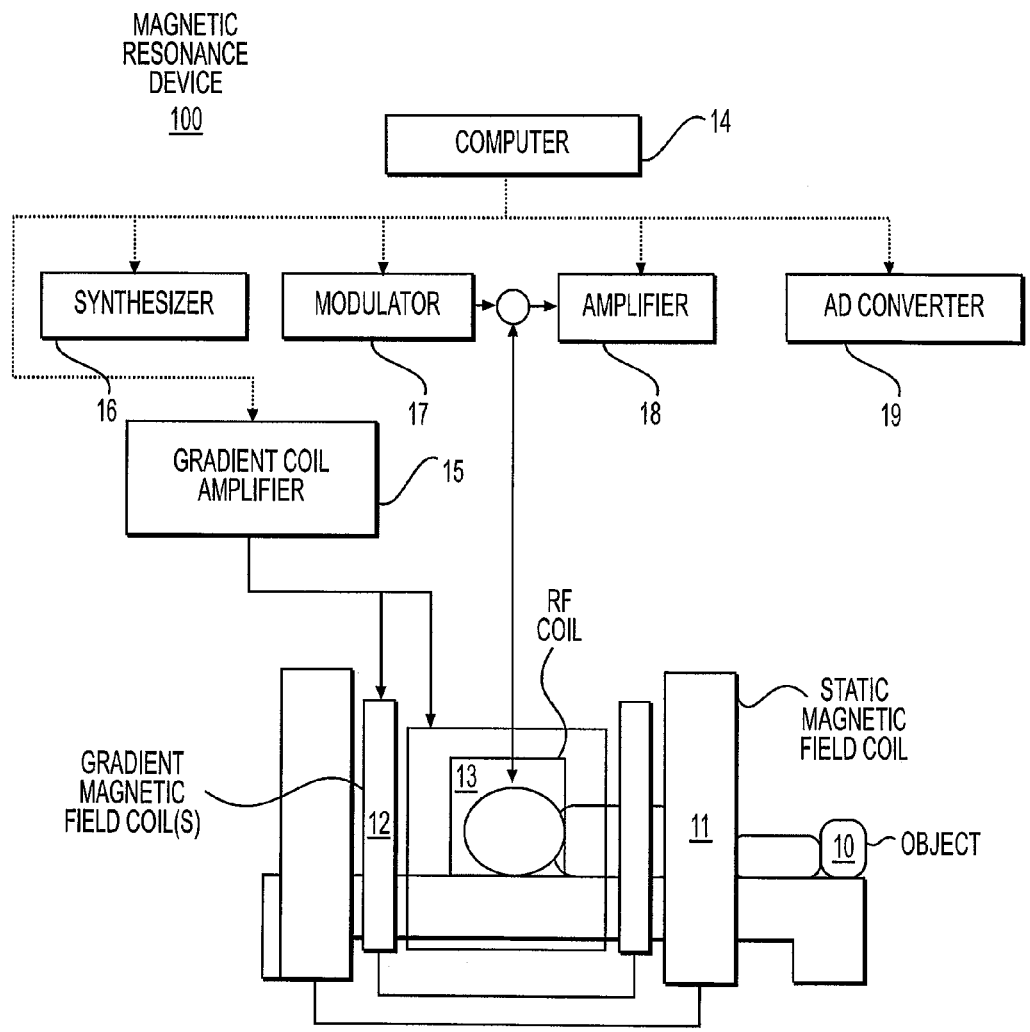
FIG. 1 is a configurational diagram of a magnetic resonance device according to the first embodiment.

First, the device configuration of the magnetic resonance device of the present embodiment will be explained. FIG. 1 is a configurational diagram for explaining the outline of the magnetic resonance device 100 according to the present embodiment. The magnetic resonance device 100 is provided with a static magnetic field coil 11, a gradient magnetic field coil 12, a radio frequency coil 13, a computer 14, a gradient magnetic field amplifier 15, a synthesizer 16, a modulator 17, an amplifier 18, and an AD converter 19.

The synthesizer 16 generates a radio frequency wave, the modulator 17 modulates wave shape of the radio frequency wave generated by the synthesizer 16, amplifies it with electric power, and supplies an electric current to the radio frequency coil 13. When an electric current is supplied to the radio frequency coil 13, it generates a radio frequency magnetic field (excitation pulses, RF pulse) for exciting nuclear spins in an object 10 and irradiates it on the object 10. The gradient magnetic field amplifier 15 supplies an electric current to the gradient magnetic field coil 12. The gradient magnetic field coil 12 is provided with gradient magnetic field coils 12x, 12y and 12z (not shown in the drawing) for generating gradient magnetic fields in the x-axis direction, y-axis direction, and z-axis direction, respectively, and when it is supplied with an electric current from the gradient magnetic field amplifier 15, it generates gradient magnetic fields to modulate the radio frequency signals as nuclear magnetic resonance signals from the object 10 according to spatial positions. The modulated radio frequency signals are received (detected) by the radio frequency coil 13. The amplifier 18 amplifies the radio frequency signals received by the radio frequency coil 13. The AD converter 19 carries out A/D conversion of the amplified radio frequency signals and transmits them to the computer 14.

The computer 14 processes the received data, and stores and displays them. Moreover, the computer 14 controls the devices constituting the magnetic resonance device 100 so that each device operates at timings programmed beforehand, and performs the measurement. What the operation timings and intensities of the devices are preliminarily programmed therein is called pulse sequence. That is, the computer 14 of the present embodiment is provided with a data processing part for processing data obtained by the measurement, and a controlling part for performing measurement according to a pulse sequence. The computer 14 is provided with a CPU, a storage and a memory, and when the CPU loads a program stored in the storage into the memory and executes it, those functions mentioned above are realized.

Figure 2:
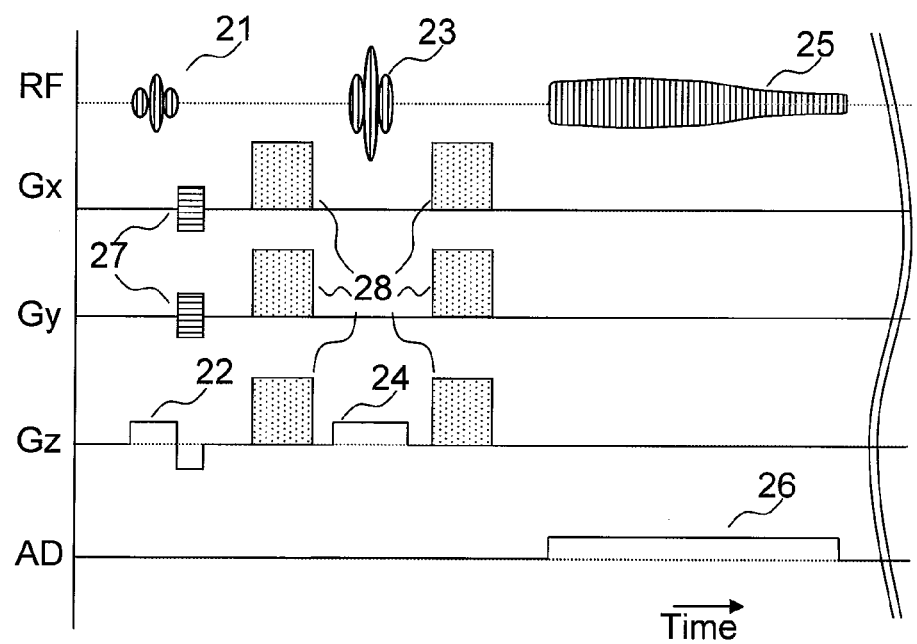
FIG. 2 shows a pulse sequence chart for 2D-CSI, which is a conventional technique for diffusion weighted SI.

In advance of explanation of the pulse sequence of the present embodiment, conventional diffusion weighted SI is explained. FIG. 2 shows a pulse sequence chart for 2D-CSI (DW-2D-CSI), which is a conventional technique for diffusion weighted SI. In FIG. 2, RF represents addition and receiving timings and intensities of radio frequency magnetic field pulses, Gx, Gy and Gz represent addition timings and magnitudes of the gradient magnetic field pulses for the x, y and z-axis directions, respectively, and AD represents the measurement duration of signals.

In DW-2D-CSI, an excitation radio frequency pulse (excitation RF pulse) 21 is added together with a slice gradient 22 to induce a nuclear magnetic resonance phenomenon in a certain slice in an object. As the excitation RF pulse 21, a π/2 pulse is typically used. Then, a phase encode gradient 27 for adding positional information for an encoding direction to phases of nuclear spins is added. Changing intensity of this phase encode gradient 27 according to a program, measurement is repeated a plurality of times. Then, magnetization in the slice is inverted by adding an inversion radio frequency RF pulse (inversion RF pulse) 23 together with a slice gradient 24. As the inversion RF pulse 23, a π pulse is typically used. And data acquisition 26 is performed by measuring a nuclear magnetic resonance signal 25 generated by the magnetization. In order to add information concerning molecular diffusion to the nuclear magnetic resonance signal 25, a diffusion gradient (motion probing gradient) 28 for inducing signal attenuation according to intensity of the molecular diffusion is added between the addition of the excitation RF pulse 21 and the data acquisition 26. The diffusion gradient 28 consists of two gradient magnetic field pulses for dephasing and rephasing, and the added amounts of these two gradient magnetic field pulses are adjusted to be equal to each other.

Figure 3A:
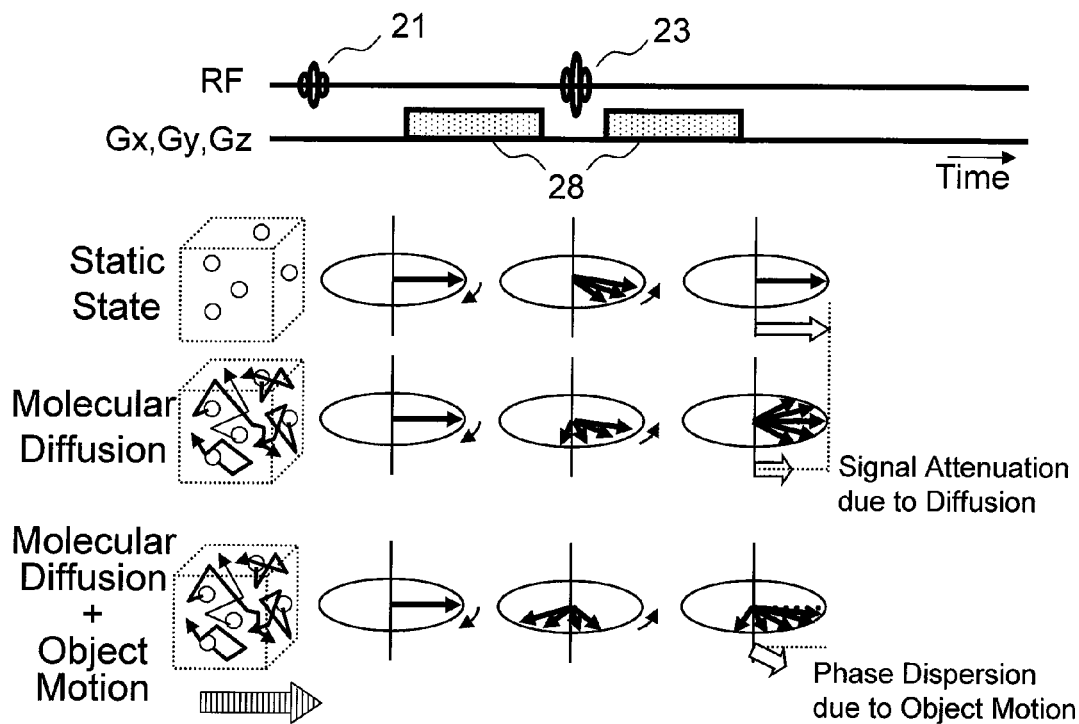
FIG. 3A is a drawing for explaining signal attenuation due to a diffusion gradient.
Figure 3B:
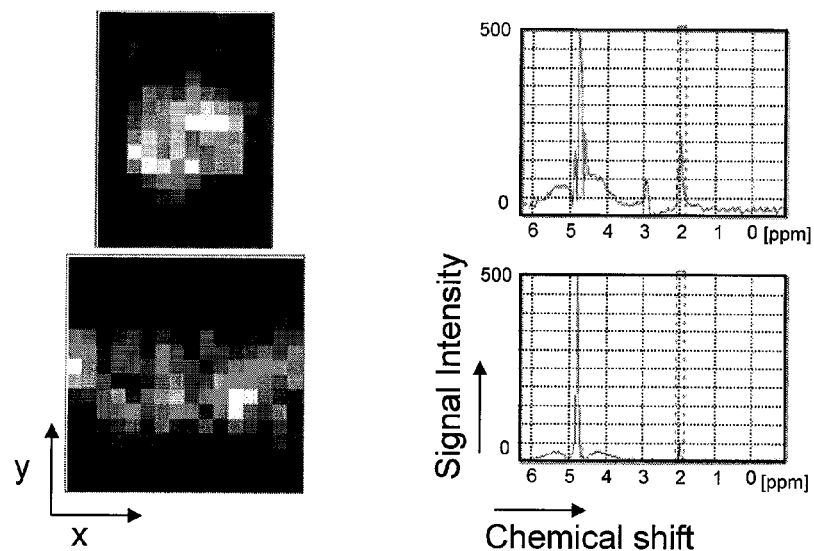
FIG. 3B is a drawing showing change of image and spectrum depending on the presence or absence of object motions.

The signal attenuation induced by the diffusion gradient 28 is explained below. FIG. 3A and FIG. 3B are drawings for explaining the signal attenuation induced by the diffusion gradient 28, in which the upper part of FIG. 3A shows a part of the pulse sequence shown in FIG. 2, and the lower part of FIG. 3A schematically shows states of molecules and nuclear magnetization thereof observed when the diffusion gradient 28 is added according to the pulse sequence shown in the upper part. As shown in the lower part of FIG. 3A, in a static state without molecular diffusion, dephasing and rephasing of the diffusion gradient 28 is well balanced, therefore all the nuclear magnetization once dephased is rephased, and concerning macroscopic magnetization represented as the sum of them, attenuation of signal quantity is not induced.

On the other hand, if there is molecular diffusion, position of nuclear magnetization once dephased changes at the time of rephasing, and therefore amount of the nuclear magnetization to be rephased is different from that of the nuclear magnetization dephased. Accordingly, all the nuclear magnetization once dephased is not rephased, and signal quantity of macroscopic magnetization attenuates. The attenuation rate is formulized as shown by the equation (1) with intensity of molecular diffusion, duration and amplitude of the diffusion gradient.

$$S(b) = S_0 \exp(-Db) \quad (1)$$

In the equation, S(b) represents signal intensity when the b-value is b, $S_0$ represents signal intensity when the b-value is 0, and D represents diffusion coefficient. The b-value [s/m²] is a value determined by amplitude and duration of the diffusion gradient, and is calculated according to the following equation (2).

$$b = \int_0^{TE} \gamma^2 |\int_0^\tau G(\tau) d\tau|^2 dt \quad (2)$$

In the equation, TE represents echo time [s], γ represents gyromagnetic ratio [Hz/T], and G(τ) represents amplitude [T/m] of the diffusion gradient at the time of τ. In particular, when the diffusion gradient is added with two pulses, the b-value is calculated according to the following equation (3).

$$b = \gamma^2 G^2 \delta^2 (\Delta - \delta/3) \quad (3)$$

In the equation, G represents amplitude [T/m] of the diffusion gradient, δ represents duration [s] of one pulse, and Δ represents interval [s] of two pulses. In the diffusion measurement, intensity of molecular diffusion can be estimated from this signal attenuation. The details of the principle of the diffusion measurement method are described in Non-patent document 4 and Patent documents 2 to 5.

On the other hand, when there is object motion in addition to the molecular diffusion, phase variation of signals is induced by the object motion as shown in the lower part of FIG. 3A. The variation caused by object motions such as pulsation and respiration is in an order of several millimeters or several to several hundreds Hz at most, and is considered to be a coherent parallel translation of a certain quantity as for the interval of the additions of the diffusion gradient 28, i.e., several ms to several tens of ms. Therefore, all the imbalance of dephasing and rephasing of the nuclear magnetization constituting the macroscopic magnetization can be considered constant, thus the signal quantity of the macroscopic magnetization is the same, but the phase thereof varies. Amount of the variation changes depending on various factors, such as difference in timings of object motion and sequence, and change in amount of object motion, and so on.

Such variation (dispersion) of the phase adds phases different from the phases originally added by the phase encoding to the signals, as a result, an image is formed at a position different from the original position at the time of imaging, and thus ghosting artifacts are generated in the phase encoding direction. Moreover, since original signal quantity is not added due to the phase variation, signal intensity attenuates from the original signal intensity in signal accumulation. In particular, when the phase is inverted, the signals may be canceled.

FIG. 3B shows differences of image and spectrum caused by presence or absence of object motion. This drawing shows the results of diffusion SI measurement carried out for water and N-acetyl aspartate put into a cylindrical sample bottle. The upper part shows the image and spectrum obtained by keeping the sample bottle stable, and the lower part shows the same obtained by moving the sample bottle, respectively. As shown in this drawing, when the sample was kept stable, a circular image was obtained, and a signal peak of N-acetyl aspartate was clearly observed in the spectrum. On the other hand, when the measurement was carried out with moving the sample, ghosting artifacts were observed in the image in the x-direction as the phase encoding direction, and the peak of N-acetyl aspartate in the spectrum attenuated. In particular, since molecular weights of chemical substances as the object of the diffusion SI other than water are larger than that of water, molecular diffusion thereof is also slow. In order to detect slow molecular diffusion with sufficient accuracy, the aforementioned b-value must be set high, and the influence of object motion also correspondingly becomes larger.

In the present embodiment, artifacts induced by the aforementioned phase variation are reduced, and attenuation of signal intensity is minimized. A pulse sequence and data processing carried out by a data processing part according to the present embodiment, which realize the above, are explained below.

Figure 4:
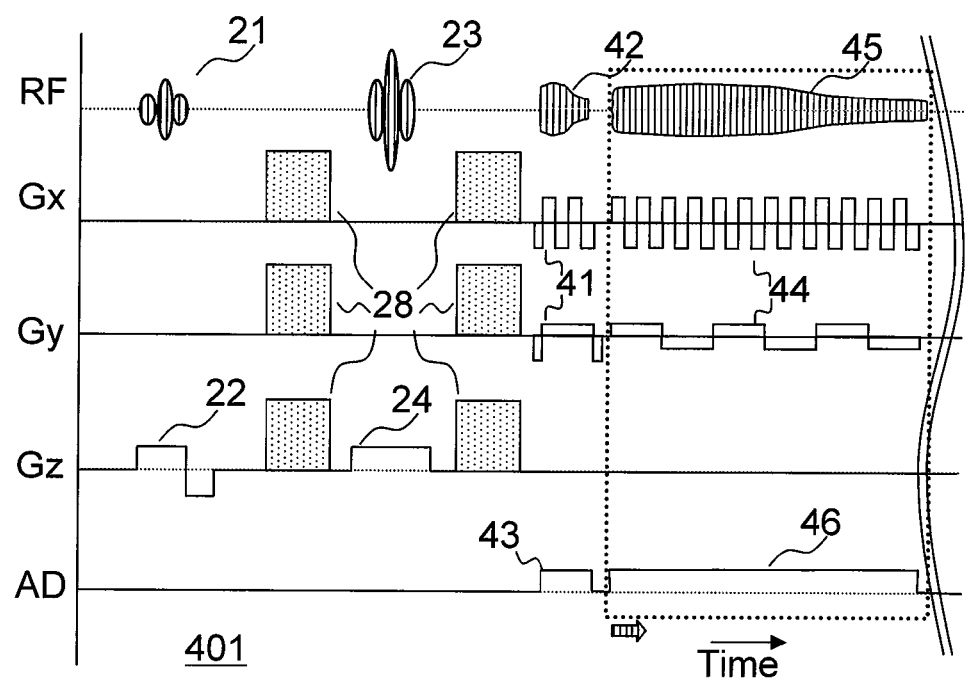
FIG. 4 shows a pulse sequence chart according to the first embodiment.

First, a pulse sequence 401 according to the present embodiment is explained. FIG. 4 is a pulse sequence chart of the pulse sequence 401 according to the present embodiment. In this drawing, RF represents timings and intensities of addition and reception of radio frequency magnetic field pulse, Gx, Gy and Gz represent timings and magnitudes of gradient magnetic field pulses for the x, y and z-axis directions, and AD represents measurement duration of signals. As shown in this drawing, in the pulse sequence 401, the phase encode gradient 27 added in the pulse sequence for the diffusion weighted 2D-CSI measurement shown in FIG. 2 is not added in order to avoid artifacts of the phase encoding direction, but instead, the diffusion gradient 28 is added, and then data are obtained with using an oscillating gradient. Furthermore, after a certain duration from the addition of the excitation RF pulse 21, navigator magnetic resonance signals are obtained.

Specifically, in the pulse sequence 401 according to the present embodiment, the excitation RF pulse 21 is added together with addition of the slice gradient 22 as shown in this drawing to induce a nuclear magnetic resonance phenomenon in a certain slice of an object. As the excitation RF pulse, a π/2 pulse is typically used. Then, the inversion RF pulse 23 is added together with the addition of the slice gradient 24 to invert the magnetization in the slice. As the inversion RF pulse, a H pulse is typically used. Further, a diffusion gradient 28 is added before and after the addition of the inversion RF pulse to add diffusion information to magnetic resonance signals to be obtained thereafter. Then, a navigator oscillating gradient 41 is added to generate a navigator magnetic resonance signal 42 to which the spatial information is added for both the x- and y-axis directions, and data acquisition 43 is performed. Then, an oscillating gradient 44 for spectroscopic imaging (SI) is added to generate a magnetic resonance signal 45 for SI to which spatial information for the x- and y-axis directions and time information t are added is generated, and data acquisition 46 is performed.

The navigator oscillating gradient 41 and the oscillating gradient 44 for SI are set so that the frequencies of the oscillating gradient added in the Gx direction and the oscillating gradient added in the Gy direction differ from each other and thus the k-space is scanned zigzag. Typically, they are set so that the period of one should be a multiple of the period of the other. In this example, the period of the oscillating gradient added in the Gy direction is set to be larger than the period of the oscillating gradient added in the Gx direction, for example.

Hereafter, in this specification, one execution of the aforementioned pulse sequence 401 is called a shot. Furthermore, in the present embodiment, interleaving in time domain is carried out by executing the aforementioned pulse sequence 401 (shot) a number of times determined beforehand with shifting the start timings of the addition of the oscillating gradient 44 for SI and the data acquisition 46, or with the same timings for obtaining a signal accumulation effect so as to repeat the data acquisition 46, and thereby fill the k-space.

Moreover, in this specification, a series of processing operations of executing the aforementioned shot a number of times required for the interleaving in time domain to collect data enabling reconstruction of a diffusion SI weighted image is called measurement. When data accumulation is required, the aforementioned measurement consisting of shots of a predetermined number of times is repeatedly performed.

In the present embodiment, the control part of the computer 14 controls the devices constituting the magnetic resonance device 100 according to the aforementioned pulse sequence 401 to obtain data. Specifically, navigation data Rr (shot, kx, ky) to which spatial information for both the x- and y-axis directions (kx, ky) are added are obtained by the data acquisition 43 for every shot, and SI data Sr (shot, time, kx, ky) consisting of spatial information for both the x- and y-axis directions (kx, ky) to which time information (time) is added are obtained by the data acquisition 46 for every shot.

Figure 5A:
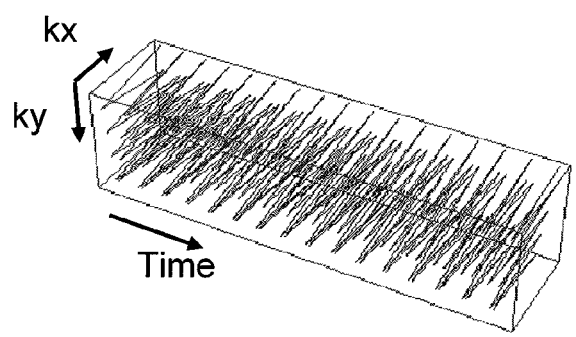
FIG. 5A shows data acquisition trajectories in the k-space according to the first embodiment.

Hereafter, filling of the k-space by the interleaving in time domain will be explained with reference to FIG. 5A, FIG. 5B, and FIG. 5C. FIG. 5A is a perspective view of trajectories of the data obtained after one addition of the oscillating gradient 44 for SI in the three-dimensional space of (time, kx, ky).

Figure 5B:
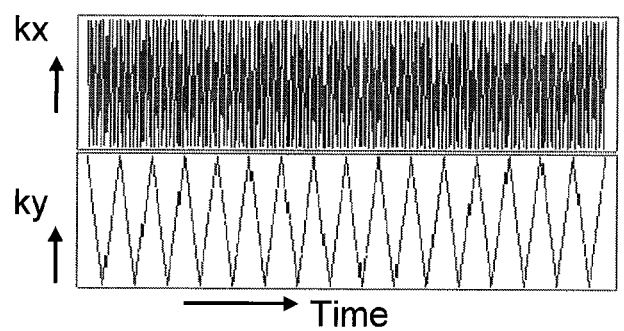
FIG. 5B shows data acquisition trajectories in the k-space according to the first embodiment.

FIG. 5B shows the trajectories of FIG. 5A projected on the two-dimensional spaces of (time, kx) and (time, ky). As seen from these drawings, with the oscillating gradient 44 for SI, oscillation is attained for the kx direction at a high speed, and also attained for the ky direction at the same time, and as a result, the three-dimensional space of (time, kx, ky) is scanned. As clearly seen from FIG. 5B, the acquisition interval for the time direction for repeatedly obtaining the same (kx, ky) depends on the amplitude and period of the oscillating gradient. Hereafter, it will be explained in detail with equations.

In general, amplitude Gr [T/m] of an oscillating gradient and desired spatial resolution ε [m] for the x- or y-direction are in the relation represented by the following equation (4).

$$Gr = \frac{2\pi}{\gamma \varepsilon N \rho} \qquad (4)$$

In the equation, N represents AD sampling number per half period (T/2 [s]), and ρ represents AD sampling interval [s].

Further, period T [s] of the SI oscillating gradient 44 and spectral bandwidth L [Hz] are in a relation represented by the following equation (5).

$$T = \frac{1}{L} \qquad (5)$$

The equation (5) is a relation expression for the case of performing data processing in which image reconstruction is individually performed for the data group obtained for each sign of the SI oscillating gradient 44 (plus or minus, polarity) at the time of the data acquisition 46, and both the results are finally added. When the data are not divided into such groups as mentioned above, the period T increases to two times the aforementioned T (when the data are divided only for one axis, and are not divided for the other axis), or 4 times the aforementioned T (when the data are not divided for both two axes). When the data are not divided, inclinations of zigzag trajectories in the k-space obtained by adding the SI oscillating gradient 44 with the signs of plus and minus are inverse to each other. Therefore, intervals between sampling points becomes more unequal in a portion closer to the end, and if the data are subjected to Fourier transform as they are, artifacts are easily produced. In contrast, if the reconstruction is performed for divided data, although it is necessary to shorten the period T, generation of artifacts can be suppressed by dividing the data according to the sign of the oscillating gradient 44 for SI to obtain equal intervals between sampling points. Furthermore, by finally adding the data of the groups, SNR can be improved.

That is, if the period T of the oscillating gradient 44 for SI becomes longer, the spectral bandwidth L becomes narrower, thus observable chemical substances are limited, or the spectrum outside the bandwidth is folded and superimposed, and therefore it may become difficult to separate chemical substances. However, the maximum amplitude and the minimum cycle of the oscillating gradient are limited by hardware restrictions for the gradient magnetic field and the maximum electromagnetic stimulation that can be given to the object. In particular, the slew rate, which is the maximum magnetic field change per unit time, is restricted by the specification of hardware and safety in view of electromagnetic stimulation, and therefore the amplitude and cycle of the oscillating gradient are restricted. For this reason, if it is intended to obtain a desired spatial resolution E, the amplitude must be increased, therefore the cycle becomes longer, and as a result, a desired bandwidth L cannot be obtained. Moreover, if the cycle is conversely shortened in order to obtain a desired bandwidth L, amplitude is decreased, and thus the desired spatial resolution s cannot be obtained. Under such restrictions, in order to obtain a desired spatial resolution ∈ and bandwidth L, the shot is repeated with shifting the start timing of the addition of the oscillating gradient 44 for SI and the data acquisition 46 for every shot to fill the k-space.

Figure 5C:
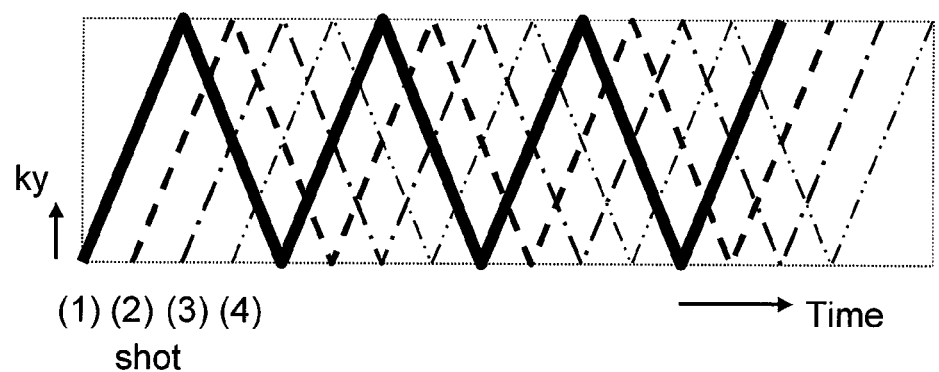
FIG. 5C is a drawing for explaining interleaving in time domain according to the first embodiment.

The scheme for filling the k-space projected on a two-dimensional space (time, ky) for the above case is shown in FIG. 5C. This drawing shows an example where one measurement is realized by four shots, and the shots are indicated with (1) solid line, (2) dashed line, (3) chain line, and (4) two-dot chain line, respectively. If the shot is repeated with shifting the start timing of the addition of the oscillating gradient 44 for SI and the data acquisition 46 as shown in this drawing, the trajectories of the data obtained by each shot shift little by little along the time direction, and the data are filled in the k-space. It can be seen that the acquisition interval along the time direction can be narrowed by combining the trajectories for all the shots. In addition, in order that the trajectories obtained in the shots are arranged with equal intervals in the time direction, the shot number M, the spectral bandwidth L, and the period T of the oscillating gradient must be in the relation represented by the following equation (6).

$$T = \frac{1}{ML} \quad (6)$$

Figure 7:
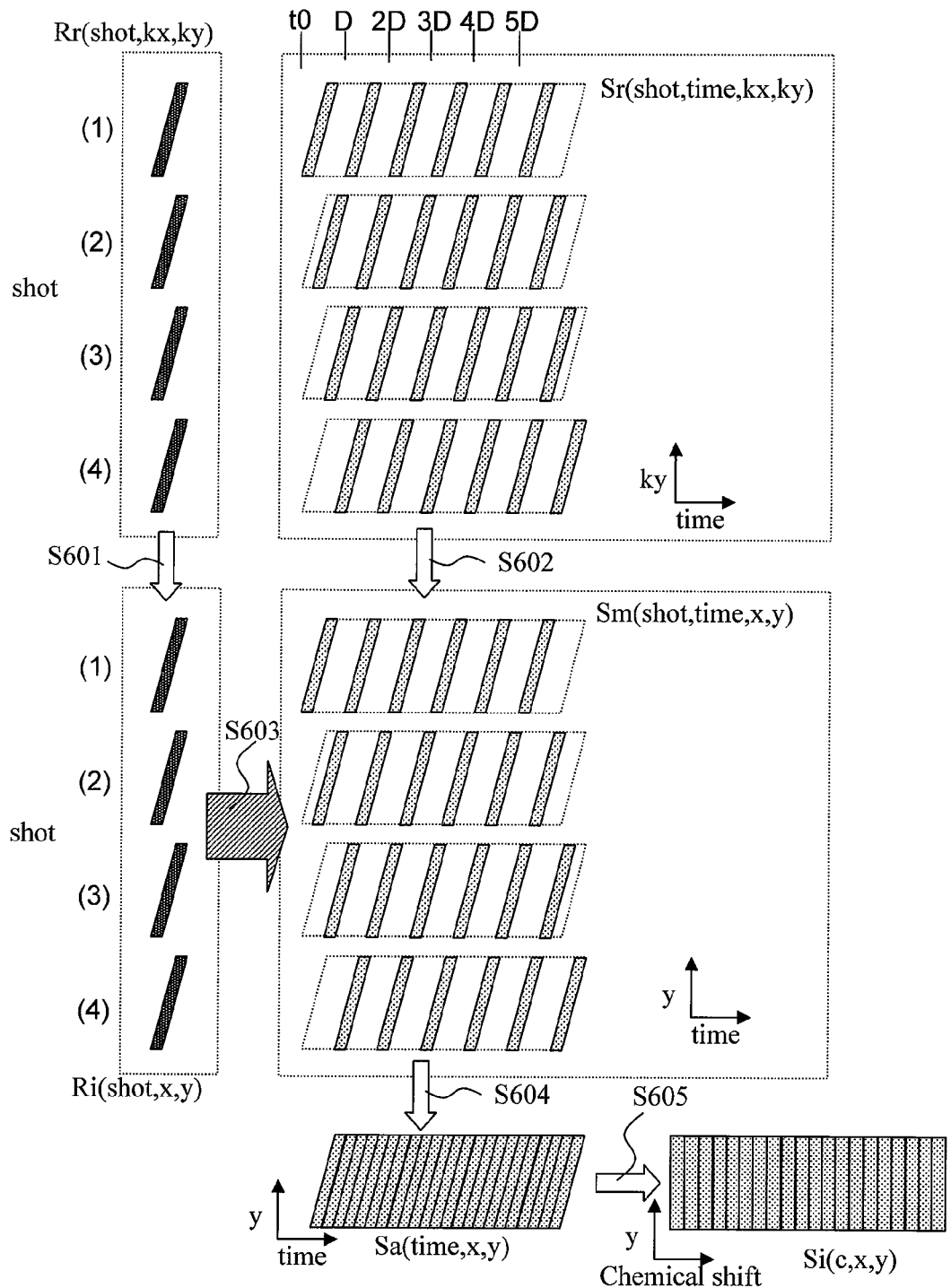
FIG. 7 is a schematic diagram of the data processing according to the first embodiment.

Hereafter, the data processing performed by the data processing part of the computer 14 will be explained with reference to FIG. 6 and FIG. 7. The data processing part processes the data obtained according to the aforementioned pulse sequence 401 to obtain a diffusion weighted image SI. FIG. 6 shows the process flow of the data processing according to the present embodiment. Further, FIG. 7 is a schematic diagram of the data processing showing relationship thereof with the steps shown in the process flow of FIG. 6. FIG. 7 shows an example where the number of shots is 4 ((1) to (4)), and six data are obtained in the time direction.

The data processing according to the present embodiment is started upon receiving a notice that all the measurements are finished from the control part. First, image reconstruction is performed in the kx and ky directions for the navigation data Rr (shot, kx, ky) of each point (kx, ky) in the k-space for every shot obtained by the data acquisition 43 to calculate a navigation image Ri (shot, x, y) of each point (x, y) in the real space for every shot (Step S601). For the image reconstruction, two-dimensional Fourier inverse transform is typically used.

Then, image reconstruction is performed in the kx and ky directions for SI data Sr (shot, time, kx, ky) of each point (kx, ky) in the k-space for every shot and time obtained by the data acquisition 46 to calculate intermediate data Sm (shot, time, x, y) of each point (x, y) in the real space for every shot and time (Step S602). For the image reconstruction, two-dimensional Fourier inverse transform is typically used.

Then, each of the phases of the intermediate data Sm (shot, time, x, y) is corrected by using the phase of the navigation image Ri (shot, x, y) of the same position (x, y) in the real space obtained by the same shot (Step S603). This phase correction is realized by subtracting the phase of the navigation image Ri (shot, x, y) from the phase of the intermediate data Sm (shot, time, x, y). By the processing of this step S603, variation of the phases generated by object motions is reduced (corrected).

Then, for the intermediate data Sm (shot, time, x, y), an alignment processing in the time direction is performed to calculate intermediate data Sa (time, x, y) (Step S604). The alignment processing used here is a processing for arranging the data of each shot obtained by the interleaving in time domain in the order of acquisition time. The details thereof will be described later.

Finally, for the intermediate data Sa (time, x, y), frequency analysis in the time direction is performed to calculate a diffusion weighted SI image Si (c, x, y) for every molecule c (Step S605) and finish the data processing. For the frequency analysis, one-dimensional Fourier inverse transform is typically used.

The diffusion weighted SI image Si (c, x, y) obtained by the above processing is displayed as an SI image on a display (not shown in the drawing) connected to the computer 14. For example, as an SI image, diffusion weighted spectrum for each point (x, y) in the space, area of certain spectral peak, and maximum peak value are calculated, and thus a diffusion weighted image or the like is displayed. Further, fitting calculation may be performed for this diffusion weighted image with a plurality of b-values for which at least one of amplitude, direction and timing of the diffusion gradient is changed to calculate ADC for each point (x, y) in the space, and the obtained ADCs may be displayed as an ADC map.

The details of the alignment processing will be explained below. For simplicity, explanation will be made with data of the same position (x, y) in the space. Namely, description of (x, y) of the intermediate data Sm (shot, time, x, y) obtained by the step S603 is omitted, shot numbers successively given to the shots is used as a variable specifying each shot {1,2, 3, ... M} (M is the shot number), the timing of the start of the first data acquisition for the first shot is represented by t0, and time interval of data acquisition and number of data acquired in each shot are represented by D and N, respectively. Since the data acquisition interval in each shot is D, and the number of shots is M, each shot is executed with shifting the time for starting acquisition of SI data by a unit of D/M in order to realize the interleaving in time domain. In addition, M and N are positive integers. In the following explanations, an example where M and N are 4 or larger will be explained.

The intermediate data Sm that can be obtained from SI data obtained by the first shot are represented as Sm (1, t0 ), Sm (1, t0+D), Sm (1, t0+2D), ... Sm (1, t0+(N−1)D). Further, the intermediate data Sm that can be obtained from SI data obtained by the second shot (second intermediate data) are represented as Sm (2, t0+D/M), Sm (2, t0+D/M+D), Sm (2, t0+D/M+2D), ... Sm (2, t0+D/M+(N−1)D). The intermediate data Sm obtained from SI data obtained by the third shot are represented as Sm (3, t0+2D/M), Sm (3, t0+2D/M+D), Sm (3, t0+2D/M+2D), ... Sm (3, t0+2D/M+(N−1)D). Similarly, the intermediate data Sm obtained from SI data obtained by the M-th shot are represented as Sm (M, t0+(M−1) D/M), Sm (M, t0+(M−1)D/M+D), Sm (M, t0+(M−1)D/M+2D), ... Sm (M, t0+(M−1)D/M+(N−1)D).

In the alignment processing performed in the step S604, all the intermediate data of all the shots are arranged along the time direction in the order of acquisition time as shown in FIG. 7 to obtain Sm (1, t0), Sm (2, t0+D/M), Sm (3, t0+2D/M) ... Sm (M, t0+(M−1)D/M), Sm (1, t0+D), Sm (2, t0+D/M+D), Sm (3, t0+2D/M+D) ... Sm (M, t0+(M−1)D/M+D), ... Sm (1, t0+(N−1)D), Sm (2, t0+D/M+(N−1)D), Sm (3, t0+2D/M+(N−1)D), Sm (M, t0+(M−1)D/M+(N−1)D). The aforementioned explanation explains an arithmetic method of the alignment processing, and the data may actually be moved in a memory region, or there may be used a configuration that a pointer indicating the memory region is moved as the result of the alignment processing result without moving the data. Since the data amount in this measurement frequently becomes large, the processing of the latter type in which a pointer is moved is advantageous in view of computing speed.

Further, when the aforementioned measurement is repeated a plurality of times for data accumulation, an accumulation processing may be performed in the step S604 in addition to the alignment processing. That is, with retaining the data obtained in every measurement, the steps up to the step S603 are repeated, and after the alignment processing of the step S604, the accumulation processing is performed.

The accumulation processing mentioned above refers to, when there are intermediate data Sm (shot, time, x, y) or intermediate data Sa (time, x, y) specified with the same parameters, a processing of adding them. In addition, either the alignment processing or the accumulation processing may be performed first. For example, when the accumulation processing is performed after the alignment processing is performed, a memory region for the intermediate data Sa (time, x, y) is prepared, and the intermediate data Sa of the same (time, x, y) are successively added in it. On the other hand, when the alignment processing is performed after the accumulation processing is performed, a memory region for the intermediate data Sm (shot, time, x, y) is prepared, and the intermediate data Sm of the same (shot, time, x, y) are successively added in it before the alignment processing, and after the accumulation processing, the aforementioned alignment processing is performed.

In addition, although not explained in detail in the explanation of the aforementioned process flow, the navigation data Rr and the SI data Sr are separated according to the polarity of the oscillating gradient, and then calculation is performed. That is, in the aforementioned step S601, the navigation data Rr are separated into two groups according to the polarity of the navigator oscillating gradient 41 added in the x-axis direction (Gx) at the time of the data acquisition 43, and after reconstruction of the navigation image Ri from the data of each group, they are added. Further, in the step S602, the SI data Sr are divided into four groups according to the polarity of the oscillating gradient 44 for SI added in the x-axis direction (Gx) and the y-axis direction (Gy) at the time of the data acquisition 46, and after reconstruction of the intermediate data Sm from the data of each group, they are added.

Further, the processing is started upon receiving a notice that all the measurements are finished from the controller in the aforementioned process flow. However, the configuration is not limited to such a configuration. For example, it may be configured so that whenever each shot is finished, the processing is carried out up to the step S603, and after the processing is finished to the step S603 for all the shots, the processing of the step S604 and the following steps is performed.

As explained above, according to the present embodiment, a shot for obtaining the navigation data Rr used for correction of object motion and diffusion SI data Sr is repeated according to the aforementioned pulse sequence 401 with shifting the timing for acquiring the diffusion SI data Sr, phase variation at each point in the space is calculated from the navigation data Rr for each shot, and the phase of the data for the same position in the space in the diffusion SI data obtained by the same shot is corrected by using the phase variation. Then, a series of the corrected data are aligned in the time direction, and frequency analysis is conducted for the time direction.

When a technique of interleaving in time domain is used, chemical shift information is generally obtained by using phase information. Therefore, if there is phase variation due to object motion, ghosting artifacts are generated in the spectral direction, i.e., a spectral peak appears at a chemical shift that does not originally exist. Further, generation of shift of a spectral peak in the direction of chemical shift also generates signal attenuation at the time of signal accumulation.

However, according to the present embodiment, the navigation data Rr (shot, kx, ky) are obtained for every shot, coherent phase variation due to object motion is detected in the navigation image Ri (shot, x, y) reconstructed from the navigation data Rr (shot, x, y) at the time of data processing, and the detection result is subtracted from the intermediate data Sm (shot, time, x, y). Therefore, the original phase of the SI data can be calculated.

In particular, according to the present embodiment, the two-dimensional (kx, ky) navigation data Rr (shot, kx, ky) are obtained for every shot with the navigator oscillating gradient 41 to detect phase variation at each position (x, y). Furthermore, two-dimensional (kx, ky) data are obtained in the time direction for every shot also for the data Sr for SI (shot, time, kx, ky) obtained with the oscillating gradient 44 for SI. Therefore, according to the present embodiment, the data Sr for SI can be corrected for every position (x, y) with phase variation obtained for every position (x, y). Therefore, phase variation due to object motion significantly varying depending on the position (x, y) can be corrected with sufficient accuracy. As a result, in the diffusion weighted SI image Si (c, x, y), ghosting artifacts in the spectral direction can be suppressed, and the signal attenuation at the time of signal accumulation can also be suppressed at the same time.

Further, according to the present embodiment, signals of all the nuclear magnetization in a slice selected with the excitation RF pulse 21 and the inversion RF pulse 23 are detected as described above, SNR equivalent to that obtainable by the aforementioned diffusion weighted 2D-CSI can be obtained.

In general, in measurement of biological metabolite as the object of the diffusion SI, ADC of the metabolite is low, and signal quantity is small. Therefore, the b-value tends to become higher, and the required number of times of the accumulation tends to be increased. Even in such a case, according to the present embodiment, motion artifacts can be suppressed, and spatial resolution, spectral bandwidth, and SNR can be maintained. Therefore, measurement accuracy is improved, and measurement time can be shortened.

Since the pulse sequence used in each shot of the present embodiment does not use phase encoding, ghosting artifacts in the phase encoding direction are not of course generated, either.

Figure 8:
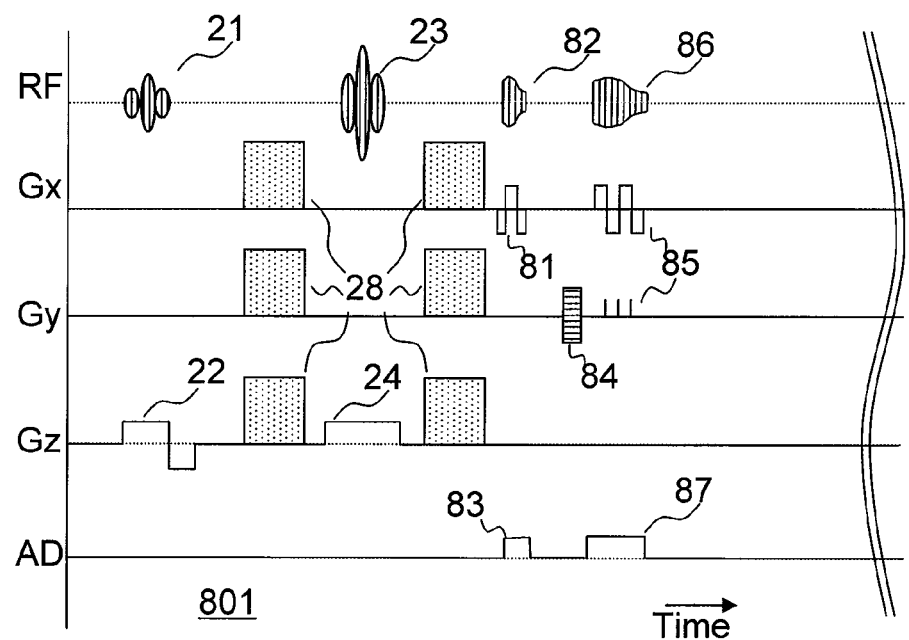
FIG. 8 shows a pulse sequence chart for the conventional diffusion weighted imaging.

Hereafter, the limit of the motion artifact suppressing effect obtainable by the conventional DWI will be explained. FIG. 8 shows a pulse sequence chart for the conventional diffusion weighted imaging (DWI). The details thereof are described in Patent documents 2 and 3. The pulse sequence 801 for the conventional DWI is the same as the pulse sequence 401 shown in FIG. 4 according to the present embodiment up to the addition of the diffusion gradient 28. Thereafter, in the conventional DWI, a one-dimensional navigator gradient 81 is added to generate a nuclear magnetic resonance signal 82 to which spatial information for the x direction is added, and data acquisition 83 is performed. Then, a phase encode gradient 84 and an oscillating gradient 85 for imaging are added to generate a nuclear magnetic resonance signal 86 to which spatial information for the x and y directions is added, and data acquisition 87 is performed. One shot realized by the above pulse sequence 801 is executed a plurality of times with changing the amplitude of the phase encode gradient 84. The method of dividing the k-space and filling data in each divided k-space, like this, is called k-space segmentation.

Figure 9:
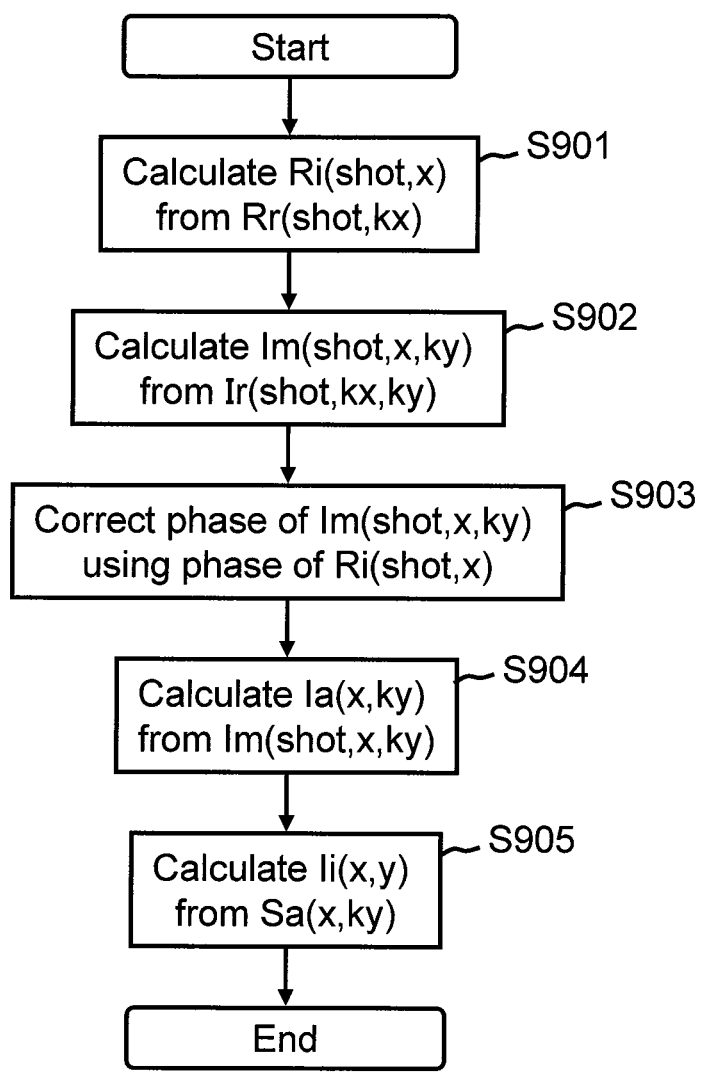
FIG. 9 is a flowchart of the data processing of the conventional diffusion weighted imaging.
Figure 10:
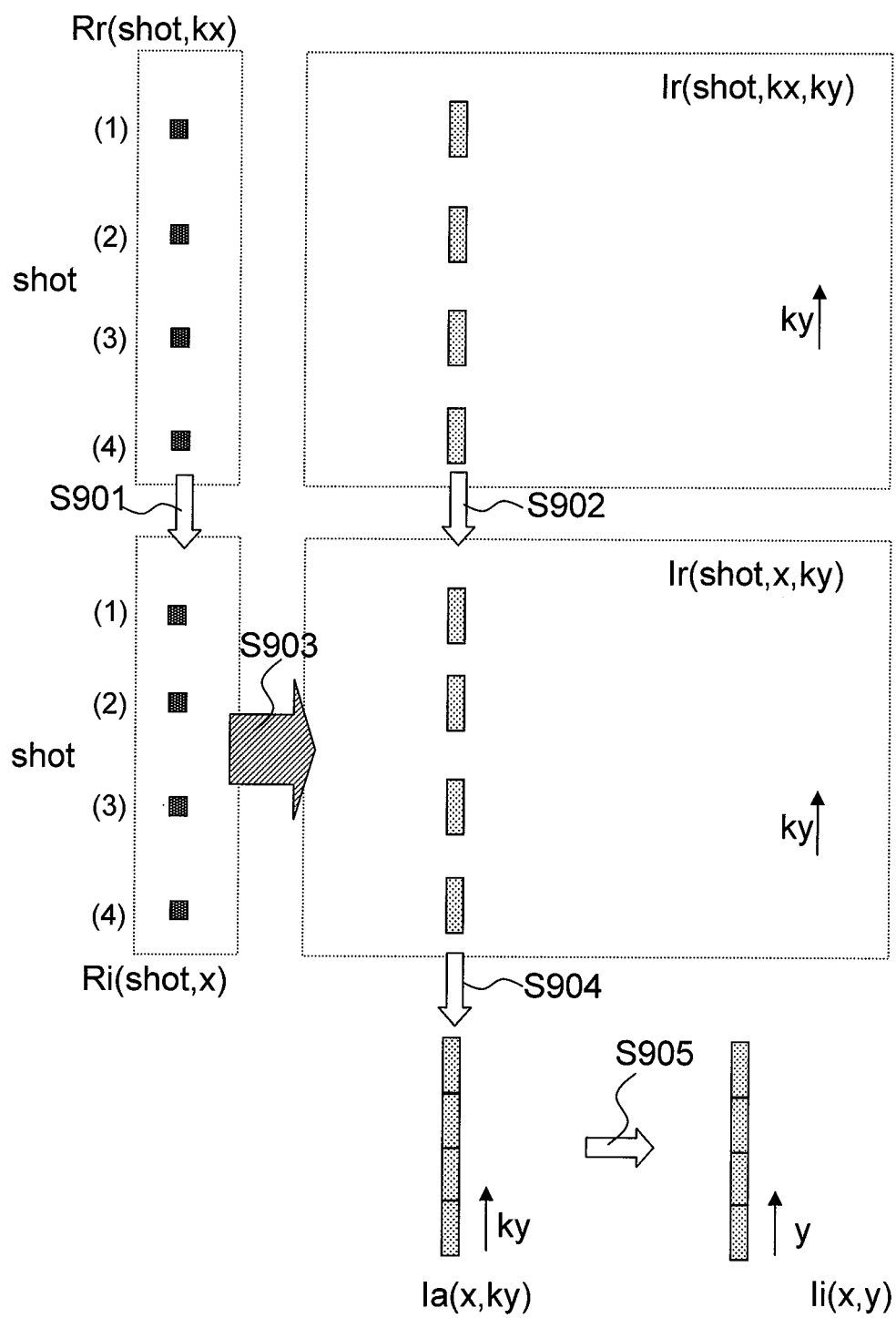
FIG. 10 shows a schematic diagram of the data processing of the conventional diffusion weighted imaging.

Hereafter, data processing in the conventional DWI will be explained with reference to FIG. 9 and FIG. 10. FIG. 9 shows a flowchart of the conventional DWI, and FIG. 10 shows a schematic diagram of the data processing performed according to the flowchart shown in FIG. 9, indicating relationship of the steps with the whole processing.

First, image reconstruction is performed in the kx direction for the navigation data Rr (shot, kx) obtained by the data acquisition 83 for every shot to calculate a navigation image Ri (shot, x) for every shot (Step S901). For the image reconstruction, one-dimensional Fourier inverse transform is typically used.

Then, image reconstruction is performed in the kx direction for imaging data Ir (shot, kx, ky) obtained by the data acquisition 87 for every shot to calculate intermediate data Im (shot, x, ky) for every shot (Step S902). For the image reconstruction, one-dimensional Fourier inverse transform is typically used also in this case.

Then, the phase of the intermediate data Im (shot, x, ky) for every shot is corrected by using the phase of the navigation image Ri (shot, x) of the same position x (Step S903). This phase correction is realized by subtracting the phase of the navigation image Ri (shot, x) obtained in the same shot from the phase of the intermediate data Im (shot, x, ky).

Then, for the intermediate data Im (shot, x, ky) for every shot, an alignment processing is performed in the ky direction to calculate intermediate data Ia (x, ky) (Step S904).

Finally, for the intermediate data Ia (x, ky), image reconstruction is performed in the ky direction to calculate an image Ii (x, y) (Step S905). For the image reconstruction, one-dimensional Fourier inverse transform is typically used. Also in the conventional DWI, an accumulation processing is carried out in the step S904, if it is performed.

As explained above, in the conventional DWI, SI is not the object, but only spatial information is obtained. Therefore, a diffusion weighted image cannot be obtained from the obtained data with separating chemical substances, or an ADC map cannot be calculated. Further, in the conventional DWI, phase variation added for all the y direction with the navigator gradient 81 is detected. Since phase variation due to object motion depends on the position as explained above, the phase variation cannot be corrected with such phase variation added for all the y direction with sufficient accuracy, and it is difficult to suppress motion artifacts.

In addition, as a modification of this conventional DWI, there is also contemplated a method of obtaining one-dimensional navigation data for the x direction and the y direction, respectively, to presume phase variation at each two-dimensional point. However, this method is not different from the above method in that phase variation at each two-dimensional point (x, y) cannot be correctly obtained with one shot, and suppression of motion artifacts by this method is also limited. In particular, in the conventional DWI, the k-space segmentation is used. Therefore, in the case of k-space segmentation in the ky direction, only the one-dimensional spatial information for the x direction is obtained with each echo, and an added signal is detected for the y direction. Therefore, even if phase variation of each two-dimensional point is obtained with the navigation data, the imaging data as the object of the correction contain only spatial information for the x direction, thus it is difficult to perform phase correction for each two-dimensional point by using them, and the phase correction is performed as one-dimensional phase correction in the x direction. Therefore, it is difficult to sufficiently correct phase variation due to object motion in the y direction, and thus motion artifact suppressing effect is also limited.

In contrast, according to the present embodiment, the required data are obtained by a technique according to interleaving in time domain, and phase variation at each point (x, y) in the space can be accurately corrected, therefore phase correction can be more correctly performed compared with the aforementioned conventional DWI, and motion artifacts can also be thereby suppressed.

Figure 11A:
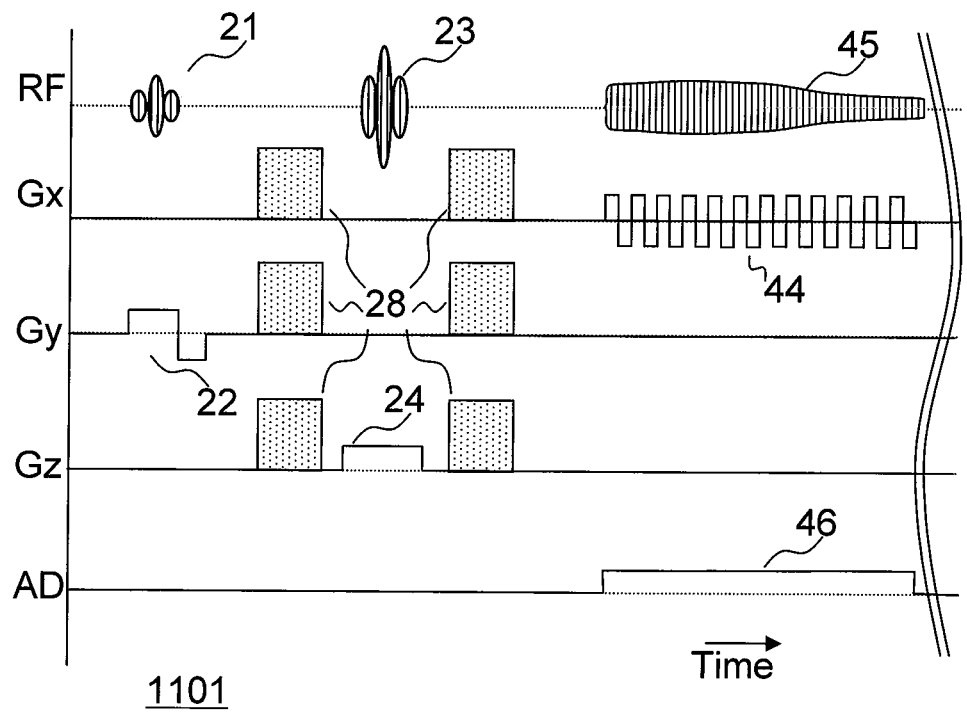
FIG. 11A shows a pulse sequence chart for conventional diffusion weighted line scan echo planar SI.

Hereafter, the limit of the motion artifact suppressing effect of another conventional DWI will be explained. FIG. 11A shows a pulse sequence chart for conventional diffusion weighted line scan echo planar SI (DW-LSEPSI). The details thereof are described in Patent document 5. As shown in this drawing, with the pulse sequence 1101 for DW-LSEPSI, the excitation RF pulse 21 is added together with addition of the slice gradient 22 to induce a nuclear magnetic resonance phenomenon in a certain slice in an object. As the excitation RF pulse 21, a π/2 pulse is typically used. Then, with adding the slice gradient 24 in a direction of an axis different from that of the slice gradient 22 (Gz axis in this case), the inversion RF pulse 23 is added. As the inversion RF pulse, a πpulse is typically used. The magnetization in a crossing region of a slice selected by the excitation RF pulse 21 and the slice gradient 22, and a slice selected by the inversion RF pulse 23 and the slice gradient 24 is inversed. By adding the diffusion gradient 28 before and after the addition of the inversion RF pulse, diffusion information is added to nuclear magnetic resonance signals to be obtained thereafter. The oscillating gradient 44 is added to generate the nuclear magnetic resonance signal 45, and data acquisition 46 is performed.

As described above, in the conventional DW-LSEPSI, nuclear magnetic resonance signals can be obtained only from one line, where the two slices each selected by two radio frequency magnetic field pulses cross, perpendicularly intersecting with a plane (y, z). The measurement for obtaining nuclear magnetic resonance signals for the one line is called one shot in this case. SI is thereby enabled without using phase encoding, and ghosting artifacts due to object motion are not generated in the direction of phase encoding. Further, as for the signal attenuation at the time of signal accumulation, spectra for each point (x, y) are obtained in every shot, and therefore if these spectra are added with performing phase correction, signal attenuation can be suppressed.

Figure 11B:
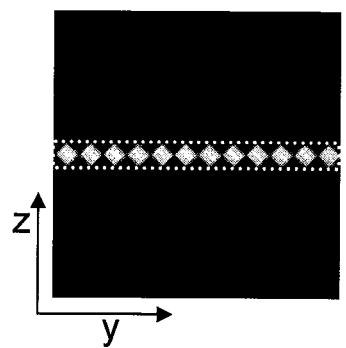
FIG. 11B is a drawing for explaining SNR in the conventional diffusion weighted line scan echo planar SI measurement.

However, in this conventional DW-LSEPSI, SNR may be decreased. It becomes remarkable especially when the excitation line is kept from exceeding the inside of the excitation slice. Such a state is shown in FIG. 11B. FIG. 11B shows the state of the excitation lines for all the shots at the (y, z) plane as an image. Those lining up side by side at the center are the excitation lines. The inside of the region between the dotted lines indicated on the upper and lower sides of the excitation lines is an excitation slice originally desired to obtain. That is, it can be seen that the region for which signals are obtained by DW-LSEPSI is a half of the region for which signals are originally desired to obtain, and SNR tends to decrease correspondingly. Further, the maximum number of the excitation lines measurable during one repetition time (TR) is limited, and a number exceeding it prolongs the measurement time, and decreases SNR per time as a result.

In contrast, according to the present embodiment, the excitation region is the same as the region for which it is originally desired to obtain signals as described above, and therefore SNR is not degraded. Further, as also for the motion artifact suppressing effect, phase variation due to object motion can be corrected similarly at two-dimensional points (x, y), and therefore the suppressing effect can be obtained at a degree similar to that of the conventional DW-LSEPSI.

In the aforementioned embodiment, SI is attained by obtaining three-dimensional data Si (c, x, y) consisting of spectrum c and position (x, y) on a two-dimensional plane defined by the x-axis and the y-axis. However, SI is not limited to such a scheme. The two-dimensional plane may be defined with other axes, or may be an oblique section. Further, it may also be configured to obtain four-dimensional data Si (c, x, y, z) by spatial three-dimensionalization (x, y, z) using multi-slice scheme. Further, it may also be configured so that the navigator oscillating gradient 41 and the oscillating gradient 44 for SI are oscillated for one more additional axis direction to scan a three-dimensional space and thereby obtain four-dimensional data Si (c, x, y, z).

Further, in the aforementioned pulse sequence 401, the timings for obtaining the navigator magnetic resonance signal 42 and the magnetic resonance signal 45 for SI may be exchanged. However, the timings for obtaining the navigator magnetic resonance signal 42 for the shots need to set after the same durations from the timing of the excitation RF pulse 21. This is because the navigation image Ri (shot, x, y) calculated from the navigator magnetic resonance signal 42 is for use in the phase correction, and it should be constituted so as not to include phase variation due to difference of lapsed time. Therefore, for example, it is realized by adjusting the waiting time after the data acquisition 46 for the magnetic resonance signal 45 for SI.

Further, in the case of diffusion weighted SI of which measurement object is $^1$H, the pulse sequence may be configured so that a water suppression pulse for preliminarily suppressing the strong water signal is added as a pre-pulse before addition of the excitation RF pulse 21. Thereby, a weak signal of a metabolite that may be buried in the water signal can be detected. However, since the water signal has high signal intensity, it is useful as data for navigation for detecting object motions, and improves accuracy of the correction. Therefore, it may be configured so that the water signal is not completely suppressed by the water suppression pulse added as a pre-pulse, but a pretreatment for adjustment for reducing the signal intensity to about $1/10$ is further added. Further, it may be configured so that an outer volume suppression (OVS) pulse is used as the pre-pulse to suppress signals from a region disturbing the measurement such as a region of subcutaneous fat.

The pulse sequence 401 shown in FIG. 4 according to the present embodiment is based on a spin echo sequence including excitation and inversion. However, the sequence used as a base is not limited to such a sequence. For example, it may be based on a sequence for the stimulated echo acquisition mode (STEAM) or point resolved spectroscopy (PRESS).

Further, the amplitude, duration, and shape of the diffusion gradient 28 may be changed. It may be configured so that the diffusion gradient 28 is added, for example, at the same amplitudes for the x, y, and z axis directions, and the obtained diffusion weighted SI images are subjected to averaging to attain isotropic diffusion weighted SI. It may also be configured so that, in order to suppress the influence of non-uniformity of the static magnetic field, the measurement is performed twice with reversing polarity positive to negative for each axis, and the results are averaged. It may also be configured so that the diffusion gradient is added for at least one of the x, y, and z axis directions at an amplitude different from that for the other axis directions to attain anisotropic diffusion weighted SI. Furthermore, it may also be configured so that an isotropic ADC map, an anisotropic ADC map, or a fractional anisotropy map is calculated from the obtained plurality of diffusion weighted SI images. It may also be configured so that diffusion tensor is calculated from a plurality of the diffusion weighted SI obtained by adding the diffusion gradient 28 in at least two directions among the x, y and z axis directions, and tractography display is performed in which such diffusion tensors are displayed in series. It is considered that, especially for a metabolite uniquely contained in neuron cells such as N-acetyl aspartate, depiction of neuronal fibers by tractography is effective (refer to, for example, Japanese Patent No. 3538726).

Furthermore, it may also be configured so that the duration of the diffusion weighted gradient 28 is changed to emphasize information of a structure that restricts molecular diffusion. The mean displacement V of diffusion is given by the following equation (7).

$$V = \sqrt{2Dt_d} \qquad (7)$$

In the equation, $t_d$ represents diffusion time, and it is given by the following equation (8) for a typical pulse-like diffusion gradient.

$$t_d = \Delta - \frac{\delta}{3} \qquad (8)$$

Therefore, by controlling the diffusion time $t_d$, restricted or hampered diffusion due to a structure at a distance smaller than the mean displacement can be emphasized. For example, ADC of N-acetyl aspartate in the living body is about $0.2 \times 10^{-9}$ m$^2$/s. If the diffusion time $t_d$ is set to be 40 ms, the mean displacement V is about 4 μm or smaller. That is, if the diffusion time is set to be 40 ms or shorter, the mean displacement becomes about 4 μm or smaller, and therefore the restriction of the molecular diffusion by cell organella becomes more dominant compared with the restriction by cell membranes. Therefore, the restricted or hampered diffusion by cell organella is emphasized. On the contrary, if the diffusion time is set to be longer than 40 ms, the mean displacement exceeds 4 μm, and therefore the ratio of the restriction by cell membranes increases.

Furthermore, the high angular resolution diffusion imaging (HARDI) is also possible, in which the direction of the diffusion gradient is radially changed to depict the mean displacement as a three-dimensional structure (refer to, for example, Japanese Patent No. 3457999). Thereby, crossing neuronal fibers can be observed.

Further, in the present embodiment, the diffusion gradient 28 having a rectangular shape is added. However, the shape of the diffusion gradient 28 is not limited to rectangular. For example, in order to suppress eddy current, a sinusoidal shape may be used. It may also be configured so that the diffusion gradient having a bipolar shape consisting of a combination of those for dephasing and rephasing is added either before or after the addition of the inversion RF pulse 23. With such a configuration, the diffusion time can be shortened. The diffusion gradient having a bipolar shape may be added both before and after the addition of the inversion RF pulse 23. In such a case, if an object motion can be regarded as a uniform motion during a period of from addition of a previous diffusion gradient to addition of a next diffusion gradient, phase variation is not generated by the object motion. Therefore, suppression of motion artifacts becomes still easier. Further, the addition of the inversion RF pulse 23 is not indispensable, and it may be configured so that, for example, instead of adding the inversion RF pulse 23, the polarities of two gradient magnetic field pulses for dephasing and rephasing of the diffusion gradient 28 are exchanged.

In addition, the nuclide as the measurement object is not particularly limited, so long as a nuclide that generates a nuclear magnetic resonance signal is chosen. Examples of nuclide for which diffusion weighting can be easily performed include $^1$H and $^{19}$F. Since these nuclides show high gyromagnetic ratio γ, a higher b-value can be obtained with the same diffusion gradient 28. In particular, many of metabolites show low ADC, and therefore it is important to select a nuclide for which a high b-value is available.

Further, when signal accumulation is performed, signals are generally stored in the same memory region for every measurement with performing the addition. However, in the present embodiment, since phase correction is performed as described above, the signals acquired by each shot of each measurement are stored in an individual separate storage region. However, it may be configured so that the phase correction of the intermediate data Sm using the navigation image Ri of the previous measurement is completed before the data acquisition 43 of the next measurement, and the intermediate data Sm after the phase correction are stored in the same memory region for every measurement, as in the conventional method. The data storage region can be thereby made smaller, and data processing time can be shortened.

Figure 12A:
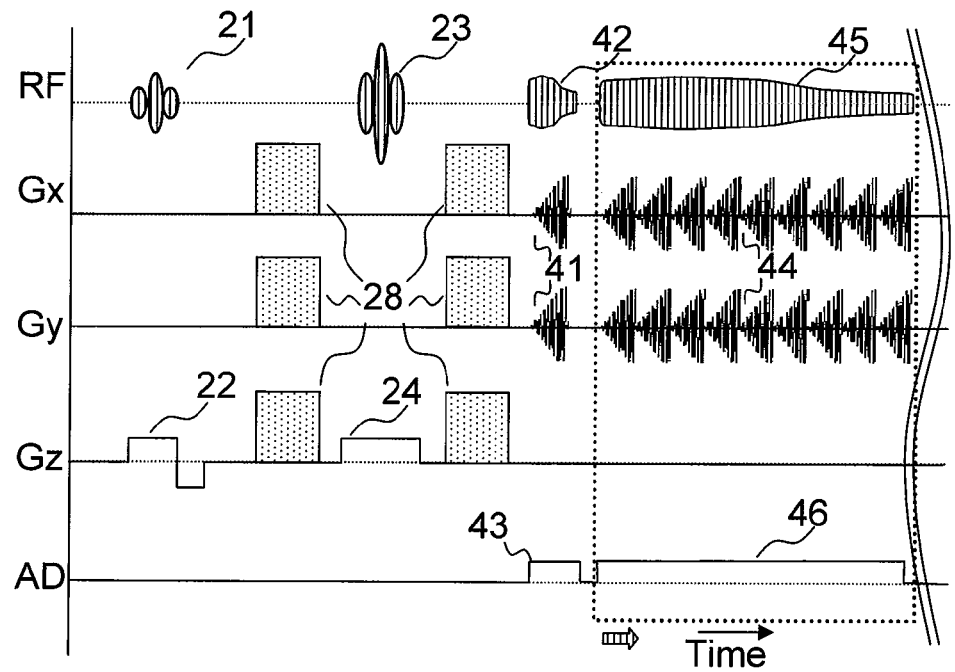
FIG. 12A shows a modification of the pulse sequence chart according to the first embodiment.
Figure 12B:
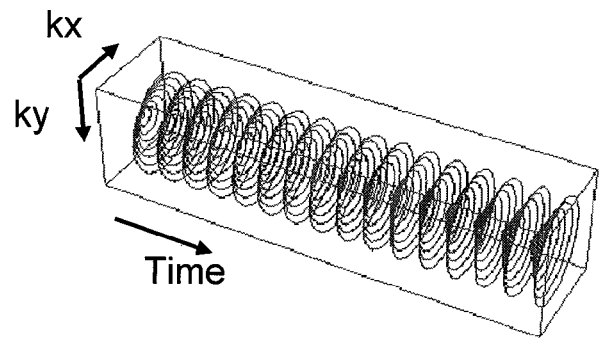
FIG. 12B is a drawing for explaining trajectories in the k-space according to the modification of the first embodiment.
Figure 12C:
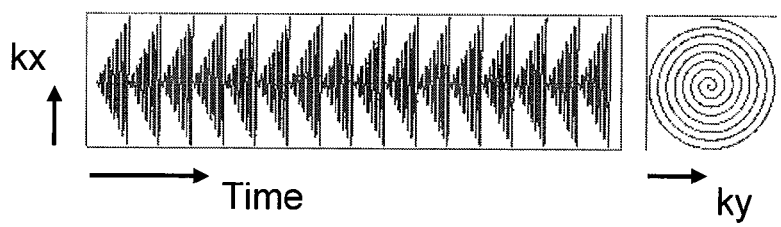
FIG. 12C is a drawing for explaining trajectories in the k-space according to the modification of the first embodiment.

Further, in the aforementioned embodiment, for the navigator oscillating gradient 41 and the oscillating gradient 44 for SI, an oscillating gradient shape of echo planer type with which scanning is performed zigzag at high speed for the x direction, with performing scanning zigzag also for the y direction. However, shapes of these oscillating gradients are not limited to such a shape. For example, an oscillating gradient having a spiral form may be used. The pulse sequence chart for such a case is shown in FIG. 12A. A perspective view of trajectories of data obtained after the oscillating gradient of a spiral form is added once in a three-dimensional space of (time, kx, ky) is shown in FIG. 12B, and the trajectories of FIG. 12B projected on two-dimensional spaces of (time, kx), and (kx, ky) are shown in FIG. 12C. For the data processing, the method shown in FIG. 6 and FIG. 7 can be used. However, when the oscillating gradient of a spiral shape is used, a gridding data processing corresponding to the spiral shape is used in the image reconstruction for the kx and ky directions.

In addition, if the oscillating gradient of the same shape is used for the navigator oscillating gradient 41 and the oscillating gradient 44 for SI, similar spatial distortions are induced by the oscillating gradients, and the same image reconstruction program can be used. However, it may also be configured so that one of them uses a shape of echo planar type, and the other uses a spiral shape.

Further, there may also be used a configuration that the range scanned with the navigator oscillating gradient 41 is narrowed, and the spatial resolution of the navigation image Ri is made lower than that of the SI image Si to shorten the time used for navigation data acquisition. The echo time (TE) can be thereby shortened, and measurement accuracy for a metabolite showing a short T2 can be improved.

Further, by applying the parallel imaging in which the number of times of the scanning of the k-space is reduced by using difference of the sensitivity distributions of a plurality of RF receiver coils, the number of points in the k-space scanned with the oscillating gradient may be reduced. For example, a shape of echo planar type may be used for the oscillating gradient for SI to halve the number of times of the scanning with the oscillating gradient in the y direction, and for compensating the reduction of the scanning number, there may be used the sensitivity encoding (SENSE) method, in which difference of the sensitivity distributions of RF receiver coils for the y direction is used. An advantage is thereby provided that since the measurement cycle for the time direction can be halved, the number of times of interleaving can be halved. Furthermore, for example, using a spiral shape as the shape of the oscillating gradient for SI, the width of trajectory of the spiral in the k-space may be doubled to halve the number of the measurement points, and for compensating the reduction of the number of the measurement points, there may be used another type of the SENSE method, in which difference of the sensitivity distributions of RF receiver coils for the x and y directions is used. An advantage is thereby provided that since the measurement cycle for the time direction can be halved, the number of times of interleaving can be halved. In this case, the reduction of the number of times of the scanning is not of course limited to reduction by half.

<<Second Embodiment>>

Hereafter, the second embodiment of the present invention will be explained. According to the present embodiment, the center frequencies of the excitation RF pulse and the inversion RF pulse to be irradiated and the center frequencies used as the reference for detection of navigator magnetic resonance signals and magnetic resonance signals for SI are separately set. The magnetic resonance device for the present embodiment is basically the same as that for the first embodiment. However, the pulse sequence for controlling operations of the devices constituting the magnetic resonance device 100 with the computer 14 is different from that of the first embodiment. Hereafter, only the configurations different from those of the first embodiment will be explained. Further, in the present embodiment, the center frequency of the pulse to be irradiated and the center frequency used as the reference for detection of signals to be received are simply referred to as center frequency of pulse and center frequency of signal, respectively.

Figure 13:
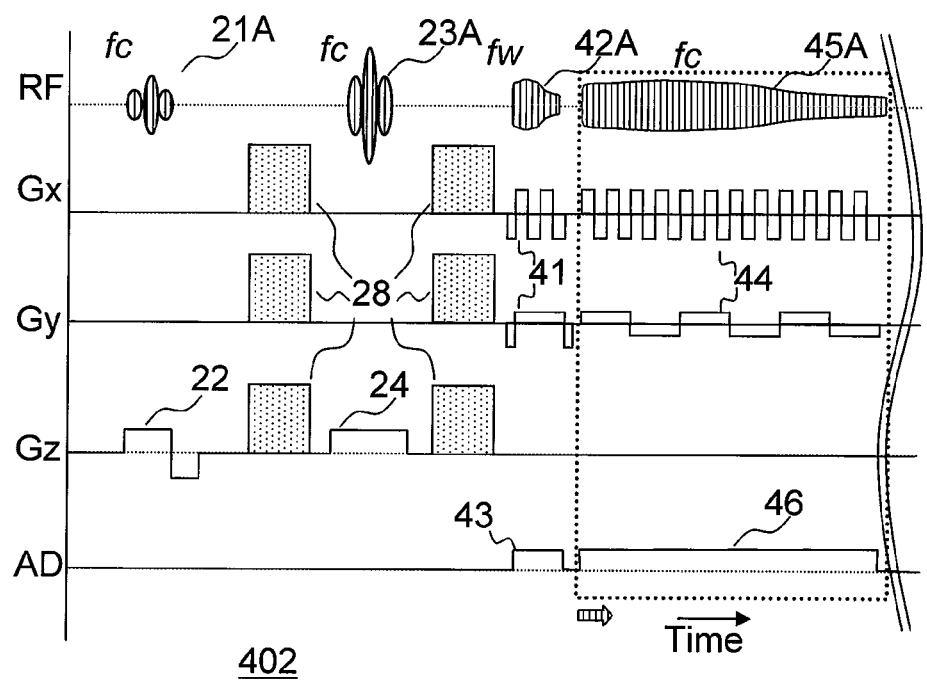
FIG. 13 shows a pulse sequence chart according to the second embodiment.

Hereafter, the pulse sequence 402 for the present embodiment will be explained. FIG. 13 shows a pulse sequence chart of a pulse sequence 402 according to the present embodiment. The pulse sequence 402 of the present embodiment is basically the same as the pulse sequence 401 of the first embodiment. However, in the present embodiment, the center frequencies of the excitation RF pulse 21A, the inversion RF pulse 22A, the navigator magnetic resonance signal 42A, and the magnetic resonance signal 45A for SI are different as described above. If the center frequency of spectral bandwidth is represented as fc, and the resonance frequency of water is represented as fw, in typical $^1$H measurement according to the present embodiment, the center frequencies of the excitation RF pulse 21A, the inversion RF pulse 22A, and the magnetic resonance signal 45A for SI are set to be fc, and the center frequency of the navigator magnetic resonance signal 42A is set to be fw, as shown in FIG. 13. That is, different center frequencies are used for obtaining the navigator magnetic resonance signal 42A and the magnetic resonance signal 45A for SI.

When the oscillating gradient 44 for SI is added, for peaks deviated from the center frequency, distortion and blurring of images tends to be generated due to aliasing or gridding processing. At the time of the acquisition of the magnetic resonance signal 45A for SI, the influence of these phenomena can be reduced by setting the center frequency to be the center of spectral bandwidth (fc). In addition, since there is generally no spectrum of an objective metabolite in a frequency region higher than that of water signal, the center of the spectral bandwidth (fc) locates in the region of frequency lower than that of water signal, and about halfway between the frequencies of water signal and fat signal.

On the other hand, the navigator magnetic resonance signal 42A is used for detection of phase variation due to object motion. In this detection, since water signal has the maximum signal intensity, if a water image is used, phase variation can be most accurately calculated. However, if a water image is calculated from data obtained by data acquisition 43 at a center frequency that is not the resonance frequency fw of water, there is generated a positional deviation corresponding to the difference of the frequencies. Therefore, the phase variation calculated on the basis of the water image also includes positional deviation, and the effect of correcting object motion may be decreased. Further, if the timing of the data acquisition 43 for navigation data shifts even slightly, phase rotation corresponding to the difference of the resonance frequency fw of water and the center frequency is contained, and the effect of correcting object motion may be decreased. According to the present embodiment, in order to reduce these two types of influences, the center frequency is set to be the resonance frequency fw of water at the time of the data acquisition 43 for the navigator magnetic resonance signal 42A.

Also in the present embodiment, the measurement is performed by interleaving in time domain, in which a shot corresponding to one execution of the pulse sequence 402 is executed a number of times determined beforehand with shifting the start timings of the addition of the oscillating gradient 44 for SI and the data acquisition 46, as in the first embodiment.

Processing of data obtained by performing the measurement with the above pulse sequence 402 is the same as that of the first embodiment, and therefore the explanation thereof is omitted.

As explained above, according to the present embodiment, a shot for acquiring the navigation data Rr used for correction of object motion and diffusion SI data Sr is repeated a plurality of times according to the aforementioned pulse sequence 402 with shifting the timing for acquiring the diffusion SI data Sr, to obtain data for each shot. In this data acquisition, the navigation data Rr are obtained by using the frequency of the spectral peak showing the maximum signal intensity at the time of data processing as the center frequency used as the reference for the detection. As in the first embodiment, in each shot, phase variation at each point in the space is calculated from the navigation data Rr, and the phase of the data of the same position in the space in the diffusion SI data obtained by the same shot is corrected by using that phase variation. Then, a series of the corrected data are aligned in the time direction, and frequency analysis is conducted for the time direction.

Therefore, according to the present embodiment, highly precise measurement can be realized with suppressing motion artifacts and maintaining SNR, spatial resolution, spectral bandwidth, and so forth, as in the first embodiment. Furthermore, the influence of the positional shift due to the difference of the resonance frequency fw of water and the center frequency fc of the spectral bandwidth can be reduced, therefore phase variation can be accurately calculated, and more accurate measurement can be realized.

In addition, as for the influence of the positional shift mentioned above, amount of the positional shift can be calculated by using the difference of the resonance frequency fw of water and the center frequency. Therefore, there may be added a configuration that the center frequency is maintained to be fc at the time of the data acquisition 43 of the navigator magnetic resonance signal 42A, and the positional shift due to the difference between the center frequency fc and the resonance frequency fw of water is corrected in the step S601 shown in FIG. 6.

Furthermore, accurate resonance frequency fw of water may not be determined due to non-uniformity of the static magnetic field. In such a case, by obtaining two kinds of the navigator magnetic resonance signals 42A, the difference of the center frequency and the resonance frequency fw of water can be obtained.

Figure 14A:
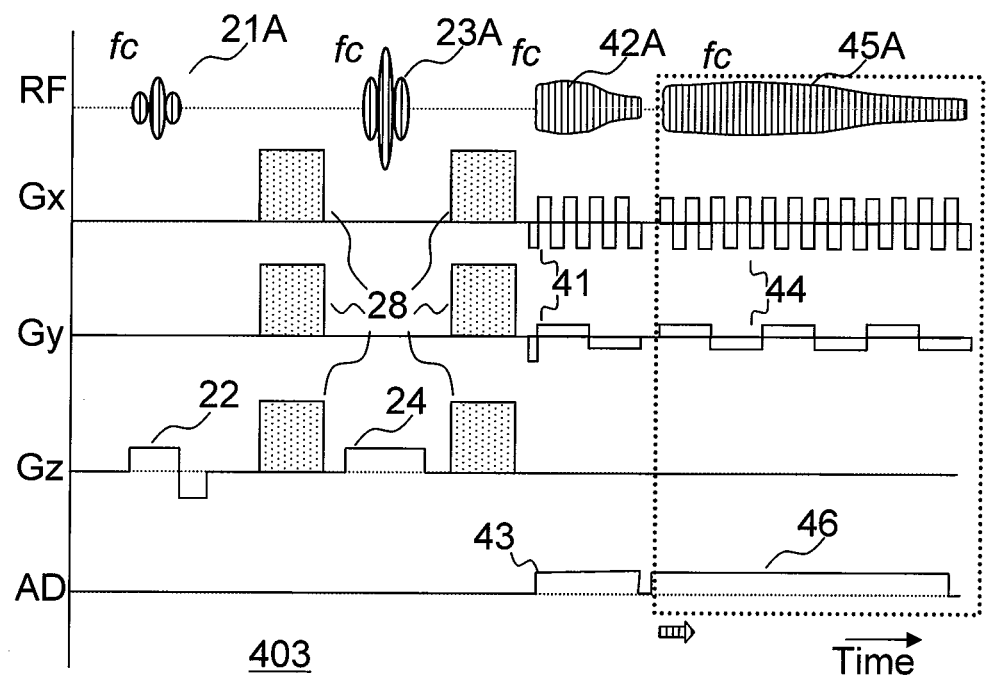
FIG. 14A shows a modification of the pulse sequence according to the second embodiment.

A pulse sequence for obtaining two kinds of the navigator magnetic resonance signals 42A is shown in FIG. 14A. In the pulse sequence 403 shown in this drawing, the center frequency at the time of the data acquisition 43 of the navigator magnetic resonance signal 42A is set to be fc the same as that of the other center frequencies, unlike the pulse sequence 402 shown in FIG. 13. Further, addition of the navigator oscillating gradient 41A is extended to obtain data also while the polarity for Gy is inverted.

Figure 14B:
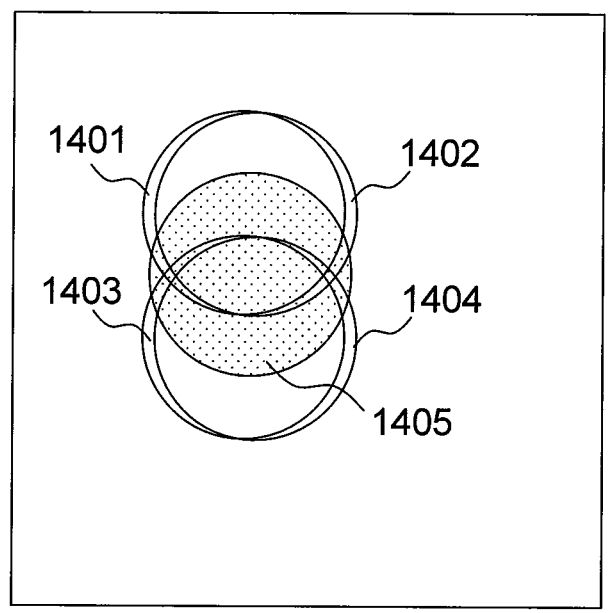
FIG. 14B shows a navigation image obtained by the measurement using the modification of the pulse sequence according to the second embodiment.

At the time of the data processing, the obtained navigation data are separated according to the polarity of the navigator oscillating gradient 41A, and are used for the image reconstruction. FIG. 14B schematically shows images of water obtained as described above. The image 1401 is an image reconstructed from data obtained while the polarity of the navigator oscillating gradient 41A added in the x direction (Gx) is positive (+), and the polarity of the navigator oscillating gradient 41A added in the y direction (Gy) is +. The image 1402 is an image reconstructed from data obtained while the polarity for Gx is negative (−), and the polarity for Gy is positive (+). The image 1403 is an image reconstructed from data obtained while the polarity for Gx is +, and the polarity for Gy is −. The image 1404 is an image reconstructed from data obtained while the polarity for Gx is −, and the polarity for Gy is −. Further, the image 1405 is an image obtained by averaging processing of the positional shifts of the images 1401 to 1404.

Depending on the difference δ [ppm] between the center frequency and the resonance frequency fw of water, a positional shift is induced for the four directions (directions for the polarities ± for two directions). Amount of the shift for the x-axis direction Δx, and amount of shift for the y-axis direction Δy are represented by the following equations (9), respectively.

$$\Delta x = \pm \frac{2\pi\delta\tau}{\gamma Gx} \qquad (9)$$

$$\Delta y = \pm \frac{2\pi\delta Tx}{\gamma Gy}$$

In the equations, Gx represents amplitude of the oscillating gradient for the x-axis direction, τ represents data sampling interval, Gy represents amplitude of the oscillating gradient for the y-axis direction, and Tx represents period of the oscillating gradient for the x-axis direction. The equations (9) are derived for the case where the oscillation is attained as a simple square wave for showing a typical case of the positional shift.

As seen from the equations (9), amount of the positional shift is small for the x-axis direction for which the oscillation is fast, and is large for the y-axis direction for which the oscillation is slow. From this amount of the positional shift, the difference δ of the center frequency and the resonance frequency fw of water can be conversely calculated. Of course, when the resonance frequency fw of water differs depending on the position as in the case that the static magnetic field shows non-uniformity, by calculating shifts at characteristic points in an image, differences of the frequencies at all the characteristic points can be calculated, and by interpolation of them, the resonance frequency can be estimated for the total region.

In addition, the present embodiment has been explained for the case where $^1$H is mainly the object of the measurement, and water is used for the navigation image Ri. However, the present embodiment is not limited to such a scheme. For example, even when $^1$H is the object, if water suppression is sufficiently performed, N-acetyl aspartate may show the maximum signal intensity in the brain. In such a case, the measurement can be performed by replacing all the occurrences of water in the above explanation with N-acetyl aspartate. The measurement may also be performed by replacing all the occurrences of water with another nuclide. Namely, it is sufficient that, in order to highly accurately detect phase variation due to object motion, the frequency used as the reference for detection of the navigator magnetic resonance signal 42A may be set to be center frequency of a chemical substance showing the maximum signal intensity in the measurement.

In addition, the various modifications explained for the first embodiment are also applicable to the present embodiment.

<<Third Embodiment>>

Hereafter, the third embodiment of the present invention will be explained. According to the present embodiment, prior to obtaining the magnetic resonance signal for SI, water signals are suppressed. The magnetic resonance device of the present embodiment is basically the same as that of the first embodiment. The pulse sequence according to the present embodiment for controlling operations of the devices constituting the magnetic resonance device 100 with the computer 14 is different from that of the first embodiment. Only the configurations different from those of the first embodiment will be explained below. This embodiment is typically for SI of which objective nuclide is $^1$H.

Figure 15:
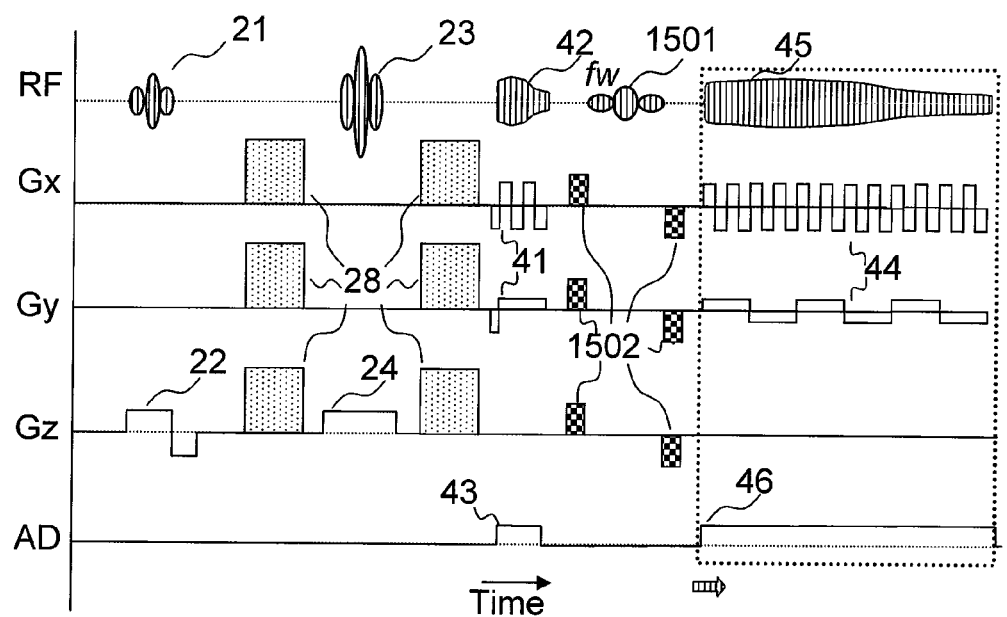
FIG. 15 shows a pulse sequence chart according to the third embodiment.

The pulse sequence 405 according to the present embodiment will be explained below. FIG. 15 shows a pulse sequence 405 according to the present embodiment. The pulse sequence 405 of the present embodiment is basically the same as that of the pulse sequence 401 of the first embodiment shown in FIG. 4. However, in the present embodiment, between the acquisition of the navigator magnetic resonance signal 42 and the magnetic resonance signal 45 for SI, a radio frequency magnetic field pulse 1501 for water suppression and a crusher pulse 1502 for signal suppression are added.

The radio frequency magnetic field pulse 1501 for signal suppression is a pulse for exciting only signals of a predetermined frequency band. Typically, a pulse having a bandwidth of 1 ppm or lower centered at the resonance frequency of water fw is used for the purpose of suppression of water signals. The crusher pulse 1502 for signal suppression is a gradient magnetic field pulse that is adjusted and added before and after the addition of the radio frequency magnetic field pulse 1501 for signal suppression so that the added amounts may be compensated. The crusher pulse 1502 for signal suppression dephases and rephases signals of metabolites other than water, and does not induce significant change of the signal quantity. However, since rotation is given to water magnetization by the radio frequency magnetic field pulse 1501 for signal suppression between the dephasing and rephasing, the latter crusher pulse 1502 for signal suppression, which is for rephasing, serves as a crusher, and suppresses water signals.

Also in the present embodiment, the measurement is performed by interleaving in time domain, in which a shot corresponding to one execution of the pulse sequence 405 is executed a number of times determined beforehand with shifting the start timings of the addition of the oscillating gradient 44 for SI and the data acquisition 46, as in the first embodiment.

Also in the present embodiment, processing of data obtained by performing the measurement with the above pulse sequence 405 is the same as that of the first embodiment, and therefore the explanation thereof is omitted.

As explained above, according to the present embodiment, a shot for acquiring the navigation data Rr used for correction of object motion and diffusion SI data Sr is repeated a plurality of times according to the aforementioned pulse sequence 405 with shifting the timing for acquiring the diffusion SI data Sr, to obtain data for each shot. In this data acquisition, between the acquisition of the navigation data Rr and the diffusion SI data, a signal suppression pulse is added. Then, as in the first embodiment, in each shot, phase variation at each point in the space is calculated from the navigation data Rr, and the phase of the data of the same position in the space in the diffusion SI data obtained by the same shot is corrected by using that phase variation. Then, a series of the corrected data are aligned in the time direction, and frequency analysis is conducted for the time direction.

Therefore, according to the present embodiment, water signals of larger signal quantity can be used for the navigation data, and at the time of measuring SI, the water signals inhibiting measurement of other metabolites due to the unduly large signal quantity can be suppressed. Since water signals not only inhibit visual understanding at the time of measuring SI, but also induce baseline errors in calculation of peak area, they may induce errors also in calculation of diffusion weighted image and calculation of ADC. Since water signals are suppressed at the time of measuring SI, the accuracy of these calculations can be improved.

That is, according to the present embodiment, highly precise measurement can be realized with suppressing motion artifacts and maintaining SNR, spatial resolution, spectral bandwidth, and so forth, as in the first embodiment. Furthermore, visibility of the diffusion SI image and accuracy of quantitative calculations can be improved by water suppression.

Although the present embodiment has been explained by exemplifying suppression of water signals, the object of the suppression is not limited to water signals. For example, when H is the objective nuclide of the measurement, fat signals generally show a low ADC, and fat signals thereof may become unduly strong in diffusion weighted SI. In such a case, frequency and band of the radio frequency magnetic field pulse 1501 for signal suppression are set so that suppression of fat signals is enabled.

Further, the various modifications explained for the first embodiment are also applicable to the present embodiment. In particular, since the time interval between the data acquisition 43 for navigation data and the data acquisition 46 for SI data cannot be lengthened, the numbers of times of additions of the radio frequency magnetic field pulse 1501 for signal suppression and the crusher 1502 for signal suppression are limited. Therefore, in order to suppress signals as the object of the suppression to a certain extent, a prepulse for signal suppression may also be used in combination.

However, in the present embodiment, in order to use water signal of large signal quantity for the navigation data, between the acquisitions of the navigator magnetic resonance signal 42 and the magnetic resonance signal 45 for SI, the radio frequency magnetic field pulse 1501 for water suppression and the crusher pulse 1502 for signal suppression are added. Therefore, in the present embodiment, the timings of the acquisitions of the navigator magnetic resonance signal 42 and the magnetic resonance signal 45 for SI cannot be exchanged.

Further, also in the present embodiment, the center frequencies of the excitation RF pulse 21, the inversion RF pulse 22, and the magnetic resonance signal 45 for SI may be set to be the center frequency fc of the spectral bandwidth, and the center frequency at the time of acquiring the navigator magnetic resonance signal 42 may be set to be the resonance frequency fw of water, as in the second embodiment. With such a configuration, phase variation can be calculated with good accuracy as in the second embodiment.

Moreover, as in the second embodiment, all the center frequencies mentioned above may be set to be the center frequency fc of spectral bandwidth, and positional shifts may be calculated from the difference of the resonance frequency fw of water and the center frequency fc of the spectral bandwidth, and corrected.

Furthermore, as in the second embodiment, when accurate resonance frequency fw of water cannot be obtained, two kinds of the navigator magnetic resonance signals 42 may be obtained by the method shown in FIG. 14A to estimate the resonance frequency fw of water.

<<Fourth Embodiment>>

Hereafter, the fourth embodiment of the present invention will be explained. According to the present embodiment, navigation data are not obtained, but the phase used for correction is calculated from SI data. The magnetic resonance device of the present embodiment is basically the same as that of the first embodiment. The pulse sequence according to the present embodiment for controlling operations of the devices constituting the magnetic resonance device 100 with the computer 14 and the data processing for processing obtained data is different from that of the first embodiment. Only the configurations different from those of the first embodiment will be explained below.

Figure 16:
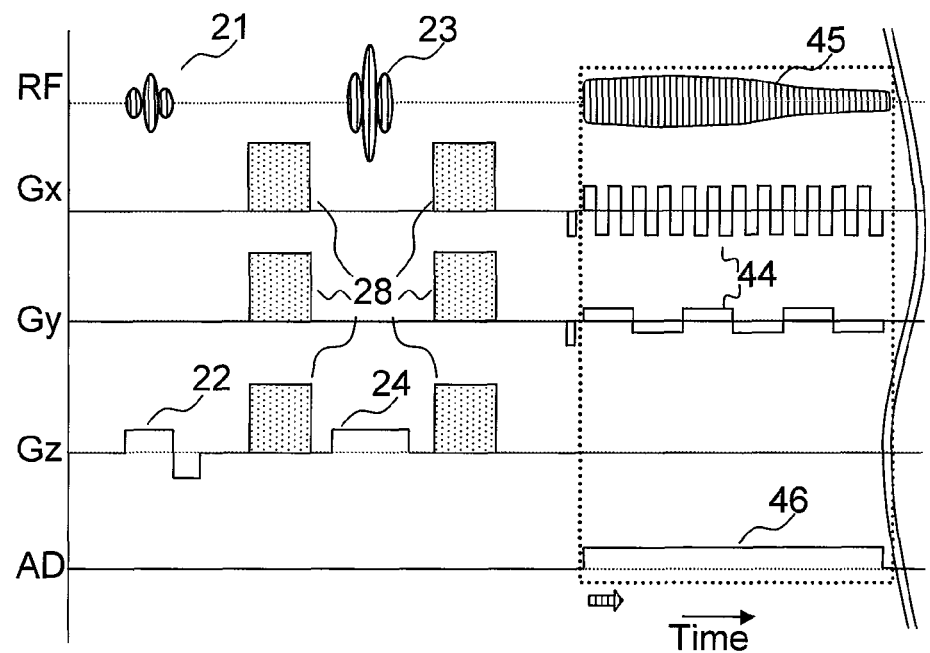
FIG. 16 shows a pulse sequence chart according to the fourth embodiment.

The pulse sequence 406 according to the present embodiment will be explained below. FIG. 16 shows a pulse sequence chart of the pulse sequence 406 according to the present embodiment. The pulse sequence 406 of the present embodiment is basically the same as that of the pulse sequence 401 of the first embodiment shown in FIG. 4. However, in the present embodiment, navigation data are not obtained as described above. Therefore, unlike the pulse sequence 401 of the first embodiment, there are not the navigator magnetic resonance signal 42, the navigator oscillating gradient 41, and the data acquisition 43 for navigation data.

Also in the present embodiment, the measurement is performed by interleaving in time domain, in which a shot corresponding to one execution of the pulse sequence 406 is executed a number of times determined beforehand with shifting the start timings of the addition of the oscillating gradient 44 for SI and the data acquisition 46, as in the first embodiment.

In the present embodiment, data processing is performed for SI data acquired from the magnetic resonance signal 45 for SI obtained by the data acquisition 46 to calculate the navigation image Ri used for correction. Hereafter, the procedure of the data processing according to the present embodiment performed by the data processing part of the computer 14 will be explained with focusing the calculation of the navigation image Ri.

Figure 17:
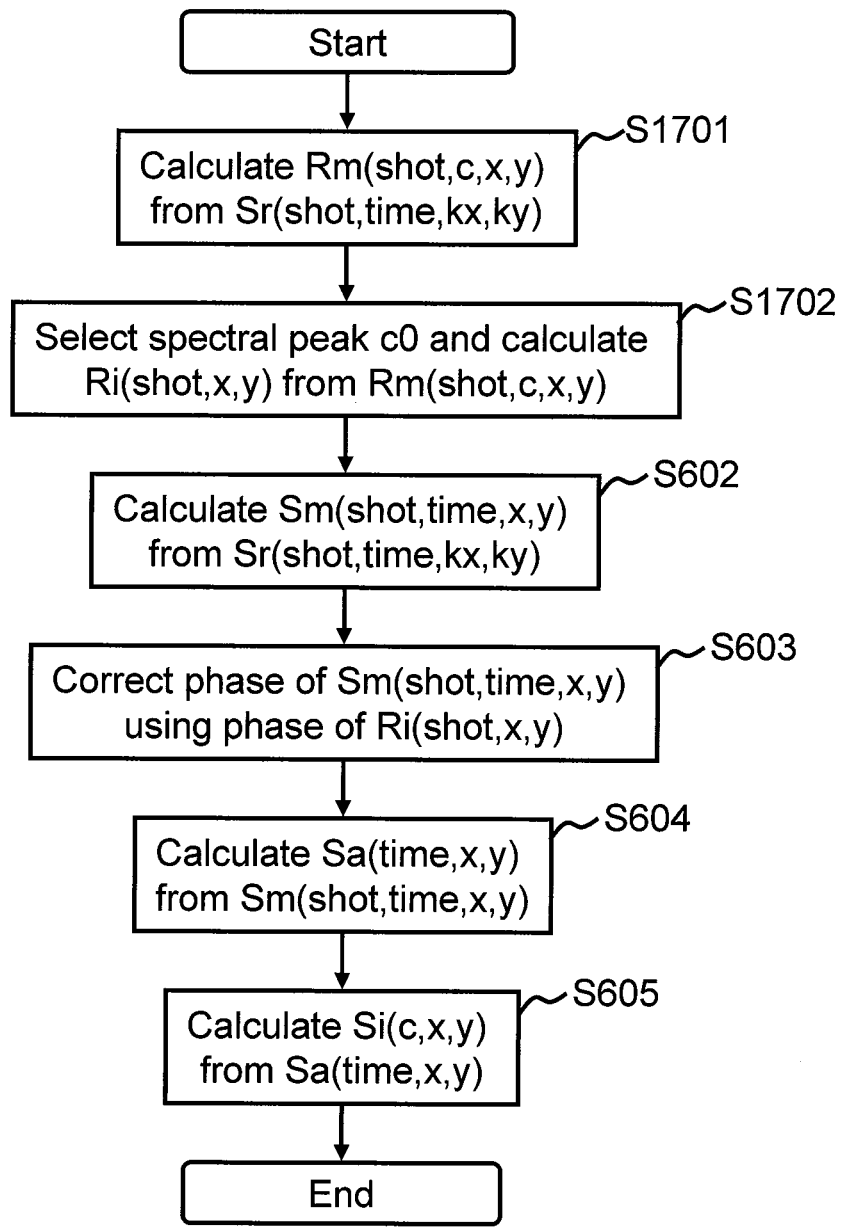
FIG. 17 is a flowchart of the data processing according to the fourth embodiment.
Figure 18:
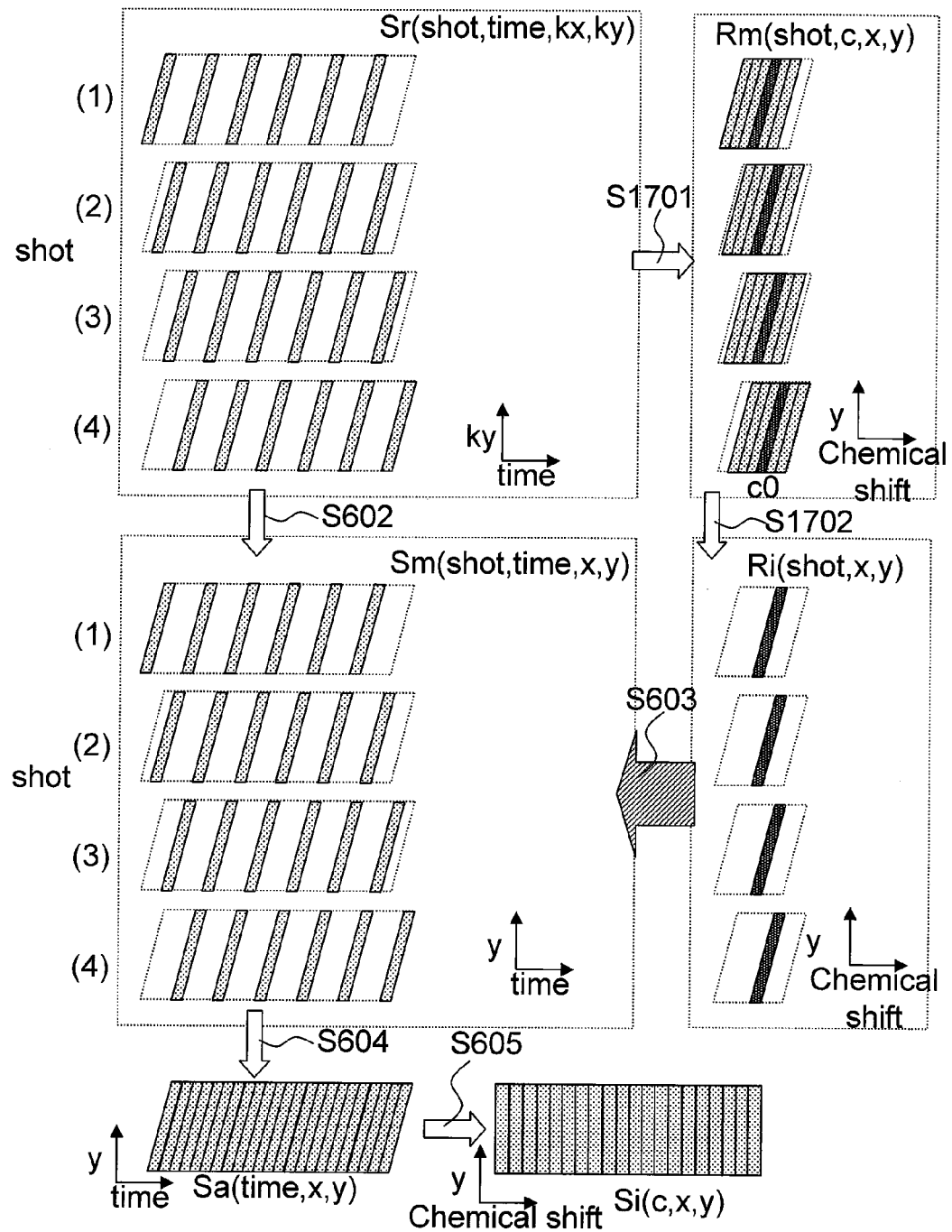
FIG. 18 is a schematic diagram of the data processing according to the fourth embodiment.

FIG. 17 shows a process flow of the data processing according to the present embodiment. Further, FIG. 18 is a schematic diagram of the data processing indicating relationship thereof with the steps shown in the process flow of FIG. 17. In this explanation, steps for performing the same processing as that of the first embodiment are given with the same numbers. Further, the data processing according to the present embodiment is also started upon receiving a notice that all the measurements are finished from the control part, as in the first embodiment.

According to the present embodiment, frequency analysis and image reconstruction are first performed in the time, kx and ky directions for SI data Sr (shot, time, kx, ky) of each point (kx, ky) in the k-space for every shot and time obtained by the data acquisition 46 to calculate navigation intermediate data Rm (shot, c, x, y) of each point (x, y) in the real space for every shot and every molecule c (Step S1701).

Then, a phase correction processing is performed for the navigation intermediate data Rm (shot, c, x, y) according to the timing of the start of each shot, only a spectral peak c0 specified beforehand is chosen, and a navigation image Ri (shot, x, y) is calculated (Step S1702).

The above phase correction according to the timing of the start of each shot is for correcting phase rotation induced by shift of the center of Fourier inverse transform in the time direction in each shot. In FIG. 18, the phase rotations according to the timings of the start of each shot are schematically shown with deviations from the frames indicated with dotted lines. Actually, a phase rotation p (shot, x, y) at a position (x, y) in the real space for every shot can be obtained according to the following equation (10) using difference Δt (shot) of the timing of the start of shot and period T of the oscillating gradient 44 for SI.

$$p(\text{shot}, x, y) = \frac{2\pi \Delta t(\text{shot})}{T} \qquad (10)$$

The difference Δt (shot) of the timing of the start of each shot is set beforehand as a measurement condition. By using the difference Δt (shot) of the timing of the start of shot and the period T of the oscillating gradient 44 for SI, phase rotation p (shot, x, y) is calculated, and this phase rotation p (shot, x, y) is subtracted from the navigation intermediate data Rm (shot, c, x, y) to perform phase correction. The phase correction is typically performed by calculating the difference Δt (shot) of the timing of the start so that the shot affording the echo time TE becomes the center of the Fourier inverse transform, namely, the phase variation p (shot, x, y) becomes 0. As the spectral peak c0 to be specified beforehand, when $^1$H is the nuclide as the object of measurement, for example, the spectral peak of water is specified.

Thereafter, processing similar to that of the steps S602 to S605 of the first embodiment is performed by using the aforementioned navigation image to obtain a diffusion weighted SI image Si (c, x, y).

In addition, in the frequency analysis for each shot, the water spectrum may be aliased due to narrowing of the spectral bandwidth. In such a case, in the step S1701, the frequency analysis is performed after frequency correction is carried out with the center frequency of water signal. A spectral peak of water not affected by aliasing can be thereby obtained.

Further, when the center frequency fw of water signal cannot be determined beforehand due to influence of non-uniformity of the static magnetic field or the like, four navigation images Ri (x, y) are calculated in the steps S1701 and 1702 on the basis of four sets of SI data classified according to the polarities of Gx and Gy of the oscillating gradient for SI, and the frequency of water signal is calculated from positional shifts of images by a method similar to that used in the second embodiment. Of course, without performing such processing, the center frequency may be set to be the resonance frequency fw of water to simplify the measurement and the data processing.

As explained above, according to the present embodiment, the aforementioned pulse sequence 406 is repeated a plurality of times with shifting the timing of the acquisition of diffusion SI data Sr to obtain data. Then, navigation data used for correction of object motion are derived from the diffusion SI data for every shot. Phase variation at each point in the space is calculated from the obtained navigation data, and the phase of the data of the same position in the space in the diffusion SI data as the source of the derivation by using the above phase variation. Then, a series of the corrected data are aligned in the time direction, and frequency analysis is conducted in the time direction.

Therefore, according to the present embodiment, highly precise measurement can be realized with suppressing motion artifacts and maintaining SNR, spatial resolution, spectral bandwidth, and so forth, as in the first embodiment. Furthermore, according to the present embodiment, since it is not necessary to obtain navigation data apart from diffusion SI data, echo time can be shortened, and measurement control can be simplified. Since the echo time can be shortened, measurement accuracy of a metabolite showing a short T2 can be improved, and it may serve as a significant advantage for diffusion SI.

In addition, also in the present embodiment, the various modifications explained for the first embodiment are also applicable. Further, as in the second embodiment, the positional shift may be calculated from the difference of the resonance frequency of water and the center frequency at the time of obtaining the magnetic resonance signal 45 for SI, and may be corrected at the time of the calculation of phase variation. Furthermore, as in the third embodiment, the radio frequency magnetic field pulse 1501 for water suppression and the crusher pulse 1502 for signal suppression may be added before acquisition of the magnetic resonance signal for SI.

The aforementioned embodiments have been described with supposing diffusion SI using resonance of nuclear spin. However, they can also be applied to electron spin resonance using resonance of electron spin.

DENOTATION OF REFERENCE NUMERALS

11: Static magnetic field coil, 12: gradient magnetic field coil, 13: radio frequency coil, 14: computer, 15: gradient magnetic field amplifier, 16: synthesizer, 17: modulator, 18: amplifier, 19: AD converter, 21: excitation RF pulse, 21A: excitation RF pulse, 22: slice gradient, 22A: inversion RF pulse, 23: inversion RF pulse, 24: slice gradient, 25: nuclear magnetic resonance signal, 26: data acquisition, 27: phase encode gradient, 28: diffusion gradient, 41: navigator oscillating gradient, 42: navigator magnetic resonance signal, 42A: navigator magnetic resonance signal, 43: data acquisition, 44: oscillating gradient for SI, 45: magnetic resonance signal for SI, 45A: magnetic resonance signal for SI, 46: data acquisition, 81: navigator gradient, 82: nuclear magnetic resonance signal, 83: data acquisition, 84: phase encode gradient, 85: oscillating gradient for imaging, 86: nuclear magnetic resonance signal, 87: data acquisition, 100: magnetic resonance device, 401: pulse sequence, 402: pulse sequence, 403: pulse sequence, 404: pulse sequence, 405: pulse sequence, 406: pulse sequence, 801: pulse sequence for conventional DWI, 1101: pulse sequence for DW-LSEPSI, 1401: image, 1402: image, 1403: image, 1404: image, 1405: image, 1501: radio frequency pulse for water suppression, 1502: crusher pulse for signal suppression

The invention claimed is:

1. A magnetic resonance device comprising:
    a static magnetic field coil configured for generating a static magnetic field, the static magnetic field coil being supplied with electric current in order to irradiate a radio frequency magnetic field on an object placed in the static magnetic field;
    a radio frequency coil configured for receiving nuclear magnetic resonance signals from the object, the radiofrequency coil being supplied with electric current in order to modulate spatially the nuclear magnetic resonance signals from the object;
    a computer configured for controlling operations of the radio frequency magnetic field and the radio frequency coil, the computer also being configured for calculating diffusion spectroscopic imaging data of the object by using the nuclear magnetic resonance signals received by the radio frequency coil, wherein the computer is configured to:
        make the static magnetic field coil add a radio frequency magnetic field pulse in order to induce a nuclear magnetic resonance phenomenon in the object,
        after the addition of the radio frequency magnetic field pulse, make the radiofrequency coil add a diffusion gradient,
        make the radio frequency coil acquire nuclear magnetic resonance signals while making the radiofrequency coil add an oscillating gradient, after the addition of the diffusion gradient,
        wherein a shot, consisting which consists of a series of operations of spatially modulating the nuclear magnetic field signals from the object, making the radiofrequency coil add the diffusion gradient, and making the radiofrequency coil acquire the nuclear magnetic resonance signals while making the radiofrequency coil add the oscillating gradient, is repeated with changing time intervals from the addition of the radio frequency magnetic field pulse up to the start of the addition of the oscillating gradient and the beginning of the acquisition of the nuclear magnetic resonance signals,
        calculate a phase variation for each position in the real space with respect to every shot,
        correct a phase of each of the nuclear magnetic resonance signals of a respective shot at a position by using the phase variation calculated above as the position in the real space of every shot,
        calculate diffusion spectroscopic imaging data from the nuclear magnetic resonance signals after the phase correction; and
        generate a phase corrected magnetic resonance diffusion spectroscopic image that is provided on a display or output of the magnetic resonance imaging device.

2. The magnetic resonance device according to claim 1, wherein making the radiofrequency coil acquire the nuclear magnetic resonance signals comprises:
    making the radio frequency coil acquire navigator magnetic resonance signals while making the static magnetic field coil add a navigator oscillating gradient with respect to every shot, after the addition of the diffusion gradient and after a certain duration from the addition of the radio frequency magnetic field pulse, and
    calculating the phase variation at each position in the real space with respect to every shot comprises calculating the phase variation at each position in the real space with respect to every shot by using the navigator magnetic resonance signals of a respective shot.

3. The magnetic resonance device according to claim 2, wherein:

the radio frequency coil uses different center frequencies, as a reference of detection, at the time of the acquisition of the navigator magnetic resonance signals and at the time of the acquisition of the nuclear magnetic resonance signals.

4. The magnetic resonance device according to claim 2, wherein:

The computer is configured to correct a position of a navigation image that is reconstructed from the navigator magnetic resonance signals by using a difference between the set center frequency of the radio frequency coil which is used as the reference of the detection, and a resonance frequency of a signal showing the maximum signal intensity from among the navigator magnetic resonance signals, before the calculation of phase variation.

5. The magnetic resonance device according to claim 2, wherein:

making the radiofrequency coil acquire the navigator magnetic resonance signals comprises:
acquiring the navigator magnetic resonance signals before acquiring the nuclear magnetic resonance signals, and
having the computer configured to make the radio frequency coil add a radio frequency pulse and a gradient magnetic field pulse, respectively, in order to suppress nuclear magnetic resonance signals located within a frequency band between the acquisition of the navigator magnetic resonance signals and the acquisition of the nuclear magnetic resonance signals.

6. The magnetic resonance device according to claim 1, wherein:

calculating the phase variation of each position in the real space with respect to every shot comprises correcting the nuclear magnetic resonance signals acquired with respect to every shot according to a starting time of an addition made to the shot, and the calculation of the phase variation at each position in the real space with respect to every shot.

7. The magnetic resonance device according to claim 1, wherein:

the oscillating gradient added by the radio frequency coil is an oscillating gradient that is configured for scanning a two-dimensional space,
the step of calculating the phase variation for each position in the real space with respect to every shot comprises calculating the phase variation at every point in the two-dimensional space, and
correcting the phase of each of the nuclear magnetic resonance signals of a respective shot comprises independently correcting the phase at every point in the two-dimensional space by using the phase variation of each point in the two-dimensional space.

8. The magnetic resonance device according to claim 1, wherein:

the oscillating gradient added by the radio frequency coil is an oscillating gradient that is configured for scanning a three-dimensional space,
the step of calculating the phase variation at each position in the real space with respect to every shot comprises calculating the phase variation at every point in the three-dimensional space, and the step of correcting the phase of each of the nuclear magnetic resonance signals of a respective shot comprises independently correcting the phase at every point in the three-dimensional space by using the phase variation of each point in the three-dimensional space.

9. The magnetic resonance device according to claim 2, wherein:

the oscillating gradient added by the radio frequency coil is an oscillating gradient that is configured for scanning a two-dimensional space,
the step of calculating the phase variation at each position in the real space with respect to every shot comprises calculating the phase variation at every point in the two-dimensional space, and
the step of correcting the phase of each of the nuclear magnetic resonance signals of a respective shot comprises independently correcting the phase at every point in the two-dimensional space by using the phase variation of each point in the two-dimensional space.

10. The magnetic resonance device according to claim 3, wherein:

the oscillating gradient added by the radio frequency coil is an oscillating gradient that is configured for scanning a two-dimensional space,
the step of calculating the phase variation at each position in the real space with respect to every shot comprises calculating the phase variation at every point in the two-dimensional space, and
the step of correcting the phase of each of the nuclear magnetic resonance signals of a respective shot comprises independently correcting the phase at every point in the two-dimensional space by using the phase variation of each point in the two-dimensional space.

11. The magnetic resonance device according to claim 4, wherein:

the oscillating gradient added by the radio frequency coil is an oscillating gradient that is configured for scanning a two-dimensional space,
the step of calculating the phase variation at each position in the real space with respect to every shot comprises calculating the phase variation at every point in the two-dimensional space, and
the step of correcting the phase of each of the nuclear magnetic resonance signals of a respective shot comprises independently correcting the phase at every point in the two-dimensional space by using the phase variation of each point in the two-dimensional space.

12. The magnetic resonance device according to claim 5, wherein:

the oscillating gradient added by the radio frequency coil is an oscillating gradient that is configured for scanning a two-dimensional space,
the step of calculating the phase variation at each position in the real space with respect to every shot comprises calculating the phase variation at every point in the two-dimensional space, and
the step of correcting the phase of each of the nuclear magnetic resonance signals of a respective shot comprises independently correcting the phase at every point in the two-dimensional space by using the phase variation of each point in the two-dimensional space.

13. The magnetic resonance device according to claim 6, wherein:

the oscillating gradient added by the radio frequency coil is an oscillating gradient that is configured for scanning a two-dimensional space, the step of calculating the phase variation at each position in the real space with respect to every shot comprises calculating the phase variation at every point in the two-dimensional space, and the step of correcting the phase of each of the nuclear magnetic resonance signals of a respective shot comprises independently correcting the phase at every point in the two-dimensional space by using the phase variation of each point in the two-dimensional space.

14. The magnetic resonance device according to claim 2, wherein:

the oscillating gradient added by the radio frequency coil is an oscillating gradient that is configured for scanning a three-dimensional space, the step of calculating the phase variation at each position in the real space with respect to every shot comprises calculating the phase variation at every point in the three-dimensional space, and the step of correcting the phase of each of the nuclear magnetic resonance signals of a respective shot comprises independently correcting the phase at every point in the three-dimensional space by using the phase variation of each point in the three-dimensional space.

15. The magnetic resonance device according to claim 3, wherein:

the oscillating gradient added by the radio frequency coil is an oscillating gradient that is configured for scanning a three-dimensional space, the step of calculating the phase variation at each position in the real space with respect to every shot comprises calculating the phase variation at every point in the three-dimensional space, and the step of correcting the phase of each of the nuclear magnetic resonance signals of a respective shot comprises independently correcting the phase at every point in the three-dimensional space by using the phase variation of each point in the three-dimensional space.

16. The magnetic resonance device according to claim 4, wherein:

the oscillating gradient added by the radio frequency coil is an oscillating gradient that is configured for scanning a three-dimensional space, the step of calculating the phase variation at each position in the real space with respect to every shot comprises calculating the phase variation at every point in the three-dimensional space, and the step of correcting the phase of each of the nuclear magnetic resonance signals of a respective shot comprises independently correcting the phase at every point in the three-dimensional space by using the phase variation of each point in the three-dimensional space.

17. The magnetic resonance device according to claim 5, wherein:

the oscillating gradient added by the radio frequency coil is an oscillating gradient that is configured for scanning a three-dimensional space, the step of calculating the phase variation at each position in the real space with respect to every shot comprises calculating the phase variation at every point in the three-dimensional space, and the step of correcting the phase of each of the nuclear magnetic resonance signals of a respective shot comprises independently correcting the phase at every point in the three-dimensional space by using the phase variation of each point in the three-dimensional space.

18. The magnetic resonance device according to claim 6, wherein:

the oscillating gradient added by the radio frequency coil is an oscillating gradient that is configured for scanning a three-dimensional space, the step of calculating the phase variation at each position in the real space with respect to every shot comprises calculating the phase variation at every point in the three-dimensional space, and the step of correcting the phase of each of the nuclear magnetic resonance signals of a respective shot comprises independently correcting the phase at every point in the three-dimensional space by using the phase variation of each point in the three-dimensional space.

* * * * *